(12) United States Patent
Yang et al.

(10) Patent No.: US 7,396,565 B2
(45) Date of Patent: *Jul. 8, 2008

(54) MULTIPLE PRECURSOR CYCLICAL DEPOSITION SYSTEM

(75) Inventors: Michael Xi Yang, Palo Alto, CA (US); Hyungsuk Alexander Yoon, Santa Clara, CA (US); Hui Zhang, Santa Clara, CA (US); Hongbin Fang, Mountain View, CA (US); Ming Xi, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 38 days.

This patent is subject to a terminal disclaimer.

(21) Appl. No.: 10/913,888

(22) Filed: Aug. 6, 2004

(65) Prior Publication Data
US 2005/0008779 A1 Jan. 13, 2005

Related U.S. Application Data

(63) Continuation of application No. 10/118,605, filed on Apr. 8, 2002, now Pat. No. 6,846,516.

(51) Int. Cl.
*C23C 16/40* (2006.01)
(52) U.S. Cl. .................. 427/255.32; 427/255.393; 427/255.7
(58) Field of Classification Search ............ 427/255.32, 427/255.393, 255.7
See application file for complete search history.

(56) References Cited

U.S. PATENT DOCUMENTS 4,693,208 A 9/1987 Sakai (Continued)

FOREIGN PATENT DOCUMENTS

EP 0 464 515 1/1992

(Continued)

OTHER PUBLICATIONS

Argarwal, et al. "Challenges in Integrating the High-K Gate Dielectric Film to the Conventional CMOS Process Flow," Mat. Sec. Soc. Sump. Proc. vol. 670 (2001).

(Continued)

*Primary Examiner*—Bret Chen
(74) *Attorney, Agent, or Firm*—Patterson & Sheridan, LLP

(57) ABSTRACT

Embodiments of the present invention relate to an apparatus and method of cyclical deposition utilizing three or more precursors in which delivery of at least two of the precursors to a substrate structure at least partially overlap. One embodiment of depositing a ternary material layer over a substrate structure comprises providing at least one cycle of gases to deposit a ternary material layer. One cycle comprises introducing a pulse of a first precursor, introducing a pulse of a second precursor, and introducing a pulse of a third precursor in which the pulse of the second precursor and the pulse of the third precursor at least partially overlap. In one aspect, the ternary material layer includes, but is not limited to, tungsten boron silicon ($WB_xSi_y$), titanium silicon nitride ($TiSi_xN_y$), tantalum silicon nitride ($TaSi_xN_y$), silicon oxynitride ($SiO_xN_y$), and hafnium silicon oxide ($HfSi_xO_y$). In one aspect, the composition of the ternary material layer may be tuned by changing the flow ratio of the second precursor to the third precursor between cycles.

15 Claims, 9 Drawing Sheets

U.S. PATENT DOCUMENTS

| | | | |
|---|---|---|---|
| 4,960,640 A * | 10/1990 | Paquette et al. ............. 428/368 |
| 5,290,609 A | 3/1994 | Horiike et al. |
| 5,374,570 A | 12/1994 | Nasu et al. |
| 5,521,126 A | 5/1996 | Okamura et al. |
| 5,807,792 A | 9/1998 | Ilg et al. |
| 5,916,365 A | 6/1999 | Sherman |
| 5,972,430 A * | 10/1999 | DiMeo et al. .......... 427/255.32 |
| 6,013,553 A | 1/2000 | Wallace et al. |
| 6,020,243 A | 2/2000 | Wallace et al. |
| 6,025,627 A | 2/2000 | Forbes et al. |
| 6,060,755 A | 5/2000 | Ma et al. |
| 6,124,158 A | 9/2000 | Dautartas et al. |
| 6,144,060 A | 11/2000 | Park et al. |
| 6,174,809 B1 | 1/2001 | Kang et al. |
| 6,200,893 B1 * | 3/2001 | Sneh ......................... 438/685 |
| 6,203,613 B1 | 3/2001 | Gates et al. |
| 6,207,487 B1 | 3/2001 | Kim et al. |
| 6,238,734 B1 | 5/2001 | Senzaki et al. |
| 6,270,572 B1 | 8/2001 | Kim et al. |
| 6,287,965 B1 * | 9/2001 | Kang et al. ................. 438/648 |
| 6,291,283 B1 | 9/2001 | Wilk |
| 6,291,867 B1 | 9/2001 | Wallace et al. |
| 6,297,539 B1 | 10/2001 | Ma et al. |
| 6,299,294 B1 | 10/2001 | Regan |
| 6,305,314 B1 | 10/2001 | Sneh et al. |
| 6,342,277 B1 | 1/2002 | Sherman |
| 6,348,386 B1 | 2/2002 | Gilmer |
| 6,372,598 B2 | 4/2002 | Kang et al. |
| 6,391,785 B1 | 5/2002 | Satta et al. |
| 6,391,803 B1 | 5/2002 | Kim et al. |
| 6,395,650 B1 | 5/2002 | Callegari et al. |
| 6,399,208 B1 * | 6/2002 | Baum et al. ................. 428/446 |
| 6,399,491 B2 * | 6/2002 | Jeon et al. ................... 438/680 |
| 6,416,577 B1 | 7/2002 | Suntola et al. |
| 6,420,279 B1 | 7/2002 | Ono et al. |
| 6,451,119 B2 | 9/2002 | Sneh et al. |
| 6,451,695 B2 | 9/2002 | Sneh |
| 6,452,229 B1 | 9/2002 | Krivokapic |
| 6,462,367 B2 | 10/2002 | Marsh et al. |
| 6,468,924 B2 | 10/2002 | Lee et al. |
| 6,475,276 B1 | 11/2002 | Elers et al. |
| 6,475,910 B1 | 11/2002 | Sneh |
| 6,482,262 B1 | 11/2002 | Elers et al. |
| 6,492,283 B2 | 12/2002 | Raaijmakers et al. |
| 6,534,395 B2 | 3/2003 | Werkhoven et al. |
| 6,599,572 B2 | 7/2003 | Saanila et al. |
| 6,607,973 B1 | 8/2003 | Jeon |
| 6,620,723 B1 | 9/2003 | Byun et al. |
| 6,632,279 B1 | 10/2003 | Ritala et al. |
| 6,874,138 B1 | 1/2004 | Halliyal et al. |
| 6,689,422 B1 * | 2/2004 | Warnes et al. ........... 427/255.11 |
| 6,720,259 B2 * | 4/2004 | Londergan et al. .......... 438/680 |
| 6,753,618 B2 * | 6/2004 | Basceri et al. ............... 257/296 |
| 6,759,325 B2 * | 7/2004 | Raaijmakers et al. ....... 438/633 |
| 6,803,272 B1 | 10/2004 | Halliyal et al. |
| 6,808,758 B1 * | 10/2004 | Thakur ....................... 427/559 |
| 6,815,285 B2 | 11/2004 | Choi et al. |
| 6,869,638 B2 * | 3/2005 | Baum et al. ............... 427/126.1 |
| 6,916,398 B2 * | 7/2005 | Chen et al. ............. 156/345.33 |
| 6,930,059 B2 * | 8/2005 | Conley et al. ............... 438/785 |
| 6,969,539 B2 * | 11/2005 | Gordon et al. ......... 427/255.29 |
| 7,205,247 B2 * | 4/2007 | Lee et al. .................... 438/785 |
| 2001/0000866 A1 | 5/2001 | Sneh et al. |
| 2001/0002280 A1 | 5/2001 | Sneh |
| 2001/0009695 A1 | 7/2001 | Saanila et al. |
| 2001/0021589 A1 | 9/2001 | Wilk |
| 2001/0024387 A1 | 9/2001 | Raaijmakers et al. |
| 2001/0024871 A1 | 9/2001 | Yagi |
| 2001/0028924 A1 | 10/2001 | Sherman |
| 2001/0029092 A1 | 10/2001 | Park et al. |
| 2001/0029891 A1 | 10/2001 | Oh et al. |
| 2001/0041250 A1 | 11/2001 | Werkhoven et al. |
| 2002/0000598 A1 | 1/2002 | Kang et al. |
| 2002/0005556 A1 | 1/2002 | Cartier et al. |
| 2002/0008297 A1 | 1/2002 | Park et al. |
| 2002/0014647 A1 | 2/2002 | Seidl et al. |
| 2002/0015790 A1 | 2/2002 | Baum et al. |
| 2002/0029092 A1 | 3/2002 | Gass |
| 2002/0031618 A1 | 3/2002 | Sherman |
| 2002/0043666 A1 | 4/2002 | Parson et al. |
| 2002/0047151 A1 | 4/2002 | Kim et al. |
| 2002/0064970 A1 | 5/2002 | Chooi et al. |
| 2002/0074588 A1 | 6/2002 | Lee |
| 2002/0076837 A1 | 6/2002 | Hujanen et al. |
| 2002/0081826 A1 | 6/2002 | Rotondaro et al. |
| 2002/0081844 A1 | 6/2002 | Jeon et al. |
| 2002/0086111 A1 | 7/2002 | Byun et al. |
| 2002/0093046 A1 | 7/2002 | Moriya et al. |
| 2002/0093781 A1 | 7/2002 | Bachhofer et al. |
| 2002/0098627 A1 | 7/2002 | Pomarede et al. |
| 2002/0106536 A1 | 8/2002 | Lee et al. |
| 2002/0146895 A1 | 10/2002 | Ramdani et al. |
| 2002/0151152 A1 | 10/2002 | Shimamoto et al. |
| 2002/0153579 A1 | 10/2002 | Yamamoto |
| 2002/0155722 A1 | 10/2002 | Satta et al. |
| 2002/0162506 A1 | 11/2002 | Sneh et al. |
| 2002/0172768 A1 | 11/2002 | Endo et al. |
| 2002/0175393 A1 | 11/2002 | Baum et al. |
| 2002/0177282 A1 | 11/2002 | Song |
| 2002/0182320 A1 | 12/2002 | Leskela et al. |
| 2002/0187256 A1 | 12/2002 | Elers et al. |
| 2002/0195643 A1 | 12/2002 | Harada |
| 2002/0197881 A1 * | 12/2002 | Ramdani et al. ............ 438/764 |
| 2003/0013320 A1 | 1/2003 | Kim et al. |
| 2003/0015764 A1 | 1/2003 | Raaijmakers et al. |
| 2003/0031807 A1 | 2/2003 | Elers et al. |
| 2003/0032281 A1 * | 2/2003 | Werkhoven et al. ......... 438/640 |
| 2003/0049931 A1 | 3/2003 | Byun et al. |
| 2003/0049942 A1 | 3/2003 | Haukka et al. |
| 2003/0060057 A1 | 3/2003 | Raaijmakers et al. |
| 2003/0068437 A1 | 4/2003 | Nakamura et al. |
| 2003/0072975 A1 | 4/2003 | Shero et al. |
| 2003/0082296 A1 | 5/2003 | Elers et al. |
| 2003/0082301 A1 | 5/2003 | Chen et al. |
| 2003/0089942 A1 | 5/2003 | Bhattacharyya |
| 2003/0096473 A1 | 5/2003 | Shih et al. |
| 2003/0104710 A1 | 6/2003 | Visokay et al. |
| 2003/0106490 A1 | 6/2003 | Jallepally et al. |
| 2003/0109114 A1 | 6/2003 | Niwa |
| 2003/0116804 A1 | 6/2003 | Visokay et al. |
| 2003/0129826 A1 | 7/2003 | Werkhoven et al. |
| 2003/0133861 A1 | 7/2003 | Bowen et al. |
| 2003/0143841 A1 * | 7/2003 | Yang et al. .................. 438/656 |
| 2003/0160277 A1 | 8/2003 | Bhattacharyya |
| 2003/0168750 A1 | 9/2003 | Basceri et al. |
| 2003/0173586 A1 * | 9/2003 | Moriwaki et al. ............ 257/200 |
| 2003/0185980 A1 | 10/2003 | Endo |
| 2003/0186495 A1 | 10/2003 | Saanila et al. |
| 2003/0186561 A1 | 10/2003 | Law et al. |
| 2003/0188682 A1 | 10/2003 | Tois et al. |
| 2003/0189232 A1 | 10/2003 | Law et al. |
| 2003/0190423 A1 | 10/2003 | Yang et al. |
| 2003/0194853 A1 | 10/2003 | Jeon |
| 2003/0205729 A1 | 11/2003 | Basceri et al. |
| 2003/0213987 A1 | 11/2003 | Basceri et al. |
| 2003/0219942 A1 | 11/2003 | Choi et al. |
| 2003/0227033 A1 | 12/2003 | Ahn et al. |
| 2003/0232501 A1 | 12/2003 | Kher et al. |
| 2003/0232506 A1 | 12/2003 | Metzner et al. |
| 2003/0232511 A1 | 12/2003 | Metzner et al. |
| 2003/0234417 A1 | 12/2003 | Raaijmakers et al. |
| 2003/0235961 A1 | 12/2003 | Metzner et al. |
| 2004/0005749 A1 | 1/2004 | Choi et al. |
| 2004/0007747 A1 | 1/2004 | Visokay et al. |

| | | | |
|---|---|---|---|
| 2004/0009307 A1 | 1/2004 | Koh et al. | |
| 2004/0009675 A1 | 1/2004 | Eissa et al. | |
| 2004/0016973 A1 | 1/2004 | Rotondaro et al. | |
| 2004/0018723 A1 | 1/2004 | Byun et al. | |
| 2004/0018747 A1 | 1/2004 | Lee et al. | |
| 2004/0023461 A1 | 2/2004 | Ahn et al. | |
| 2004/0023462 A1 | 2/2004 | Rotondaro et al. | |
| 2004/0028952 A1 | 2/2004 | Cartier et al. | |
| 2004/0029321 A1 | 2/2004 | Ang et al. | |
| 2004/0033698 A1 | 2/2004 | Lee et al. | |
| 2004/0036111 A1 | 2/2004 | Nishikawa et al. | |
| 2004/0038554 A1 | 2/2004 | Ahn et al. | |
| 2004/0040501 A1 | 3/2004 | Vaartstra | |
| 2004/0043149 A1 | 3/2004 | Gordon et al. | |
| 2004/0043569 A1 | 3/2004 | Ahn et al. | |
| 2004/0043830 A1 | 3/2004 | Vaartstra et al. | |
| 2004/0046197 A1 | 3/2004 | Basceri et al. | |
| 2004/0048491 A1 | 3/2004 | Jung et al. | |
| 2004/0051152 A1 | 3/2004 | Nakajima | |
| 2004/0053484 A1 | 3/2004 | Kumar et al. | |
| 2004/0077182 A1 | 4/2004 | Lim et al. | |
| 2004/0216670 A1 | 11/2004 | Gutsche et al. | |
| 2004/0235285 A1 | 11/2004 | Kang et al. | |
| 2005/0006799 A1 | 1/2005 | Gregg et al. | |
| 2005/0212119 A1* | 9/2005 | Shero et al. | 257/705 |

FOREIGN PATENT DOCUMENTS

| | | |
|---|---|---|
| EP | 0 973 189 | 1/2000 |
| EP | 0 973 191 | 1/2000 |
| EP | 1 146 141 | 10/2001 |
| EP | 1 170 804 | 1/2002 |
| EP | 1 321 973 | 6/2003 |
| GB | 2 355 727 A | 5/2001 |
| JP | 05-251339 | 9/1993 |
| JP | 06-196809 | 7/1994 |
| JP | 2002-060944 | 2/2002 |
| JP | 2002-69641 | 3/2002 |
| JP | 2002-93804 | 3/2002 |
| JP | 2002-167672 | 6/2002 |
| JP | 2002-172767 | 6/2002 |
| JP | 2001-111000 | 12/2002 |
| JP | 2001-172767 | 10/2003 |
| WO | WO 90/02216 | 3/1990 |
| WO | WO 99/29924 | 6/1999 |
| WO | WO 00/13235 | 3/2000 |
| WO | WO 00/54320 | 9/2000 |
| WO | WO 00/70674 | 11/2000 |
| WO | WO 01/15220 | 3/2001 |
| WO | WO 01/25502 | 4/2001 |
| WO | WO 01/27346 A1 | 4/2001 |
| WO | WO 01/27347 A1 | 4/2001 |
| WO | WO 01/29280 A1 | 4/2001 |
| WO | WO 01/29891 A1 | 4/2001 |
| WO | WO 01/29893 A1 | 4/2001 |
| WO | WO 01/40541 A1 | 6/2001 |
| WO | WO 01/66832 A2 | 9/2001 |
| WO | WO 01/82390 | 11/2001 |
| WO | WO 01/99166 | 12/2001 |
| WO | WO 02/01628 | 1/2002 |
| WO | WO 02/09167 | 1/2002 |
| WO | WO 02/27063 | 4/2002 |
| WO | WO 02/43115 | 5/2002 |
| WO | WO 02/45167 | 6/2002 |

OTHER PUBLICATIONS

Balog, et al., "Chemical Vapor Deposition and Characterization of $HfO_2$ Films from Organo-Hafnium Compounds," Thin Solid Films, 41 (1977) 247-259.

Bedair, "Atomic Layer Epitaxy Deposition Processes," J. Vac. Sci. Technol. B., vol. 12, No. 1, Jan./Feb. 1994.

Chatham, Hood; et al., "Nitridation of Hafnium Silicate Thin Films", Mat. Res. Soc. Symp. Proc. vol. 811, Apr. 12-16, 2004, D7.5.1.

Cheon, et al., "Gas Phase Photoproduction of Diatomic Metal Nitrides During Metal Nitride Laser Chemical Vapor Deposition," Inorg. Chem. 1999, 38, 2238-2239.

Choi, et al. "Stability of $TiB_2$ as a Diffusion Barrier on Silicon," J. Electrochem. Soc., vol. 138, No. 10, Oct. 1991.

Choi, et al. "The Effect of Annealing on Resistivity of Low Pressure Chemical Vapor Deposited Titanium Diboride," J. Appl. Phys. 69(11), Jun. 1, 1991.

Clark-Phelps, et al., "Engineered Tantalum Aluminate and Hafnium Aluminate ALD Films for Ultrathin Dielectric Films with Improved Electrical and Thermal Properties," Mat. Res. Soc. Symp. Proc. vol. 670 (2001).

Conley, J.F.; et al., "Interval Annealing During Alternating Pulse Deposition", Mat. Res. Soc. Symp. Proc. vol. 811, Apr. 12-16, 2004, D1.3.1.

Derbyshire, "Applications of Integrated Processing," Solid State Technology, Dec. 1994.

Elers, et al. "$NbCl_5$ as a Precursor in Atomic Layer Epitaxy," Applied Surface Science 82/83 (1994) 468-474.

George, et al., "Surface Chemistry for Atomic Layer Growth," J. Phys. Chem. (1996), 100, 13121-13131.

Hendrix, et al., "Composition Control of $Hf_{1-x}Si_xO_2$ Films Deposited on Si by Chemical-vapor Deposition Using Amide Precursors," Applied Physics Letters, American Institute of Physics, New York, US, vol. 80, No. 13, Apr. 1, 2002, pp. 2362-2364.

Ho, et al., "Suppressed crystallization of Hf-based gate dielectrics by controlled addition of $Al_2O_3$ using atomic layer deposition", Applied Physics Letters, American Institute of Physics, New York, US, vol. 81, No. 22, Nov. 25, 2002, pp. 4218-4220.

Hwang, et al. "Nanometer-Size $\alpha$-$PbO_2$-type $TiO_2$ in Garnet: A Thermobarometer for Ultrahigh-Pressure Metamorphism," Science Vo. 288 (Apr. 14, 2000).

Kattelus, et al., "Electrical Properties of Tantalum Based Composite Oxide Films," Mat. Res. Soc. Symp. Proc., 284 (1993) 511-516.

Kawahara, et al., "Effects of Hf sources, oxidizing agents, and $NH_3$ radicals on properties of $HfAlO_x$ films prepared by atomic layer deposition", IWGI 2003, Tokyo, Nov. 6, 2003, pp. 32-37.

Kukli, et al., "Atomic Layer Deposition of Hafnium Dioxide Films from Hafnium Tetrakis(ethylmethylamide) and Water", Chemical Vapor Deposition, VCH Publishers, Weinheim, DE, vol. 8, No. 5, Sep. 2002, pp. 199-204.

Kukli, et al., "Tailoring the Dielectric Properties of $HfO_2$-$Ta_2O_5$ Nanolaminates," Applied Physics Letters, vol. 68, No. 26 (Jun. 24, 1996), pp. 3737-3739.

Lee, et al. "Cyclic Technique for the Enhancement of Highly Oriented Diamond Film Growth," Thin Solid Films 303 (1997) 264-269.

Niinisto, et al., "Synthesis of Oxide Thin Films and Overlayers by Atomic Layer Epitaxy for Advanced Applications," Materials Science and Engineering B41 (1996) 23-29.

Ohshita, et al., "$Hf_{1-x}Si_xO_2$ deposition by metal organic chemical vapor deposition using the $Hf(NEt_2)_4/SiH(NEt_2)_3/O_2$ gas system", Preparation and Characterization, Elsevier Sequioa, NL, vol. 416, No. 1-2, Sep. 2, 2002, pp. 208-211.

Ohshita, et al., "$HfO_2$ Growth by Low-pressure Chemical Vapor Deposition Using the $Hf(N(C_2H_5)_2)_4/O_2$ Gas System," Journal of Crystal Growth 233 (2001) 292-297.

Ritala, et al. "Atomic Layer Deposition of Oxide Thin Films with Metal Alkoxides as Oxygen Sources," Science vol. 288 Apr. 14, 2000.

Ritala, et al., Ann. Acad. Sci. Fenn. Ser. A II. Chemica 257 (1994) 1-48.

Ritala, et al., "Development of Crystallinity and Morphology in Hafnium Dioxide Thin Films Grown by Atomic Layer Epitaxy," Thin Solid Films, vol. 250, No. 1-2, (Oct. 1, 1994), p. 72-80.

Senzaki, et al., "A Novel Atomic Layer Deposition Process to Deposit Hafnium Silicate Thin Films", Electrochemical Society Proceedings vol. 2004-01, pp. 264-270.

Visokay, et al., "Application of HfSiON as a gate dielectric material", Applied Physics Letter, American Institute of Physics, New York, US, vol. 80, No. 17, Apr. 29, 2002, pp. 3183-3185.

Goto, et al. "Atomic layer controlled deposition of silicon nitride with self-limiting mechanism," Applied Physics Letters, American Institute of Physics. New York, US, vol. 68, No. 23, Jun. 3, 1996, pp. 3257-3259.

International Search Report for International Application No. PCT/US2005/016606 dated Aug. 22, 2005.

International Search Report for International Application No. PCT/US2005/016603 dated Sep. 15, 2005.

International Search Report for International Application No. PCT/US2005/016690 dated Aug. 22, 2005.

Kamiyama, et al. "Improvement in the uniformity and the thermal stability of Hf-silicate gate dielectric by plasma-nitridation," Gate Insulator, 2003. IWGI 2003. Extended Abstracts of International Workshop on Nov. 6-7, 2003, Piscataway, NJ, USA, IEEE, Nov. 6, 2002, pp. 42-46.

Sekine, et al. "Nitrogen profile control by plasma nitridation technique for poly-Si gate HfSiON CMOSFET with excellent interface property and ultra-low leakage current," International Electron Devices Meeting 2003. IEDM. Technical Digest. Washington, DC, Dec. 8-10, 2003, New York, NY, IEEE, US, Dec. 8, 2003, pp. 103-106.

Written Opinion of the International Search Report for International Application No. PCT/US2005/016606 dated Aug. 22, 2005.

Written Opinion of the International Search Report for International Application No. PCT/US2005/016603 dated Sep. 15, 2005.

Written Opinion of the International Search Report for International Application No. PCT/US2005/016690 dated Aug. 22, 2005.

* cited by examiner

MULTIPLE PRECURSOR CYCLICAL DEPOSITION SYSTEM

CROSS-REFERENCE TO RELATED APPLICATIONS

This application is a continuation of U.S. patent application Ser. No. 10/118,605, filed Apr. 8, 2002, which issued as U.S. Pat No. 6,846,516 on Jan. 25, 2005 and is herein incorporated by reference.

BACKGROUND OF THE INVENTION

1. Field of the Invention

Embodiments of the present invention generally relate to an apparatus and method of deposition utilizing multiple precursors. More particularly, embodiments of the present invention relate to an apparatus and method of cyclical deposition utilizing multiple precursors in which delivery of at least two of the precursors to a substrate structure at least partially overlap.

2. Description of the Related Art

Reliably producing sub-micron and smaller features is one of the key technologies for the next generation of very large scale integration (VLSI) and ultra large scale integration (ULSI) of semiconductor devices. However, as the fringes of circuit technology are pressed, the shrinking dimensions of interconnects in VLSI and ULSI technology have placed additional demands on the processing capabilities. The multilevel interconnects that lie at the heart of this technology require precise processing of high aspect ratio features, such as vias and other interconnects. Reliable formation of these interconnects is very important to VLSI and ULSI success and to the continued effort to increase circuit density and quality of individual substrates.

As circuit densities increase, the widths of vias, contacts, and other features, as well as the dielectric materials between them, decrease to sub-micron dimensions (e.g., 0.20 micrometers or less), whereas the thickness of the dielectric layers remains substantially constant, with the result that the aspect ratios for the features, i.e., their height divided by width, increase. Many traditional deposition processes have difficulty filling sub-micron structures where the aspect ratio exceeds 4:1. Therefore, there is a great amount of ongoing effort being directed at the formation of substantially void-free and seam-free sub-micron features having high aspect ratios.

Atomic layer deposition is one deposition technique being explored for the deposition of material layers over features having high aspect ratios. One example of atomic layer deposition of a binary material layer comprises the sequential introduction of pulses of a first precursor and a second precursor. For instance, one cycle for the sequential introduction of a first precursor and a second precursor may comprise a pulse of the first precursor, followed by a pulse of a purge gas and/or a pump evacuation, followed by a pulse of a second precursor, and followed by a pulse of a purge gas and/or a pump evacuation. Sequential introduction of separate pulses of the first precursor and the second precursor results in the alternating self-limiting chemisorption of monolayers of the precursors on the surface of the substrate and forms a monolayer of the binary material for each cycle. The cycle may be repeated to a desired thickness of the binary material. A pulse of a purge gas and/or a pump evacuation between the pulses of the first precursor and the pulses of the second precursor serves to reduce the likelihood of gas phase reactions of the precursors due to excess amounts of the precursor remaining in the chamber. Therefore, there is a need for an improved apparatus and method of atomic layer deposition utilizing three or more precursors.

SUMMARY OF THE INVENTION

Embodiments of the present invention relate to an apparatus and method of cyclical deposition utilizing three or more precursors in which delivery of at least two of the precursors to a substrate structure at least partially overlap. One embodiment of depositing a ternary material layer over a substrate structure comprises providing at least one cycle of gases to deposit a ternary material layer. One cycle comprises introducing a pulse of a first precursor, introducing a pulse of a second precursor, and introducing a pulse of a third precursor in which the pulse of the second precursor and the pulse of the third precursor at least partially overlap. In one aspect, the ternary material layer includes, but is not limited to, tungsten boron silicon ($WB_xSi_y$), titanium silicon nitride ($TiSi_xN_y$), tantalum silicon nitride ($TaSi_xN_y$), silicon oxynitride ($SiO_xN_y$), and hafnium silicon oxide ($HfSi_xO_y$). In one aspect, the composition of the ternary material layer may be tuned by changing the flow ratio of the second precursor to the third precursor between cycles.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

Process Chamber Adapted for Cyclical Deposition

Figure 1:
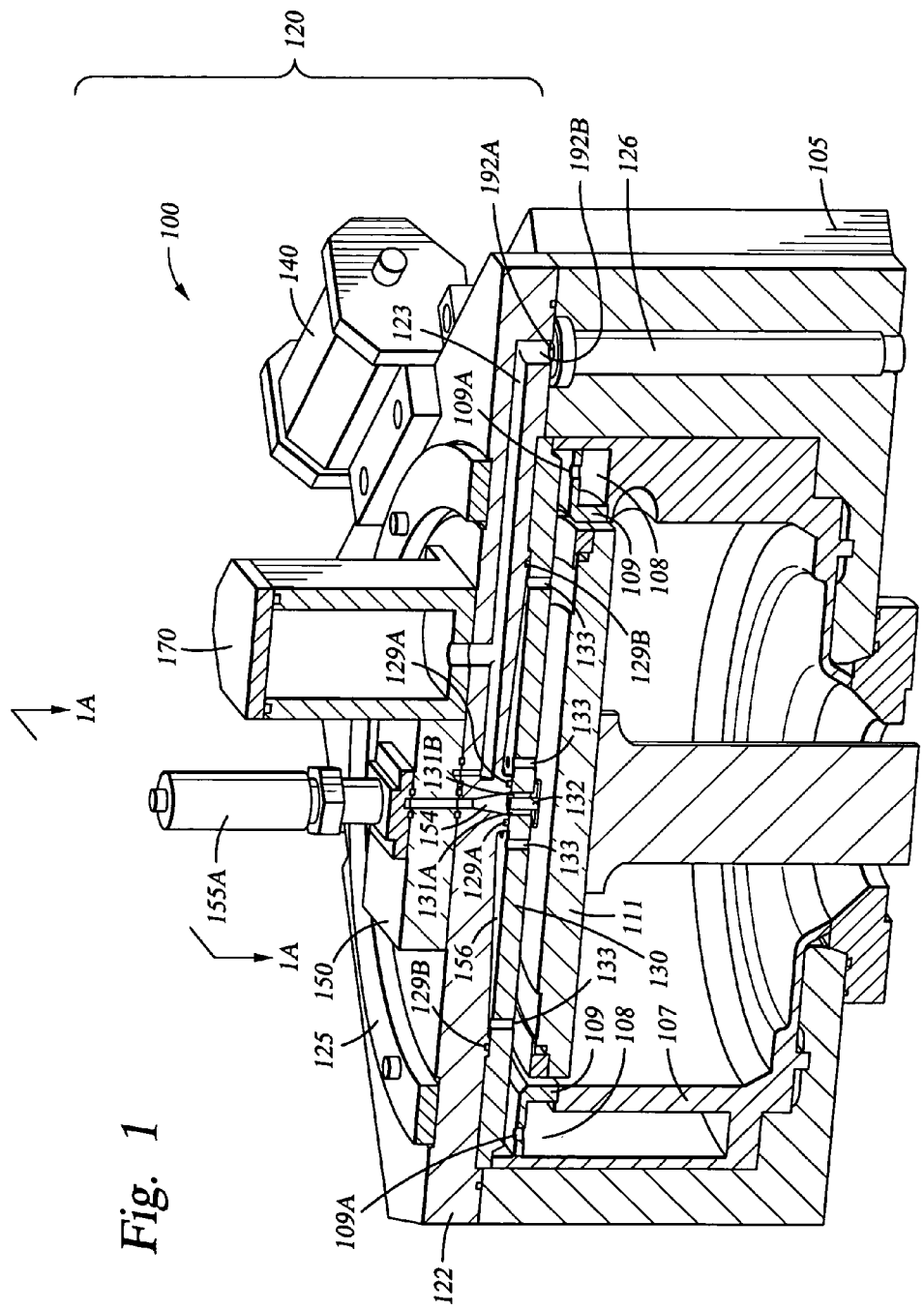
FIG. 1 is a partial cross-sectional perspective view of one embodiment of a processing system adapted to perform cyclical deposition.
Figure 1A:
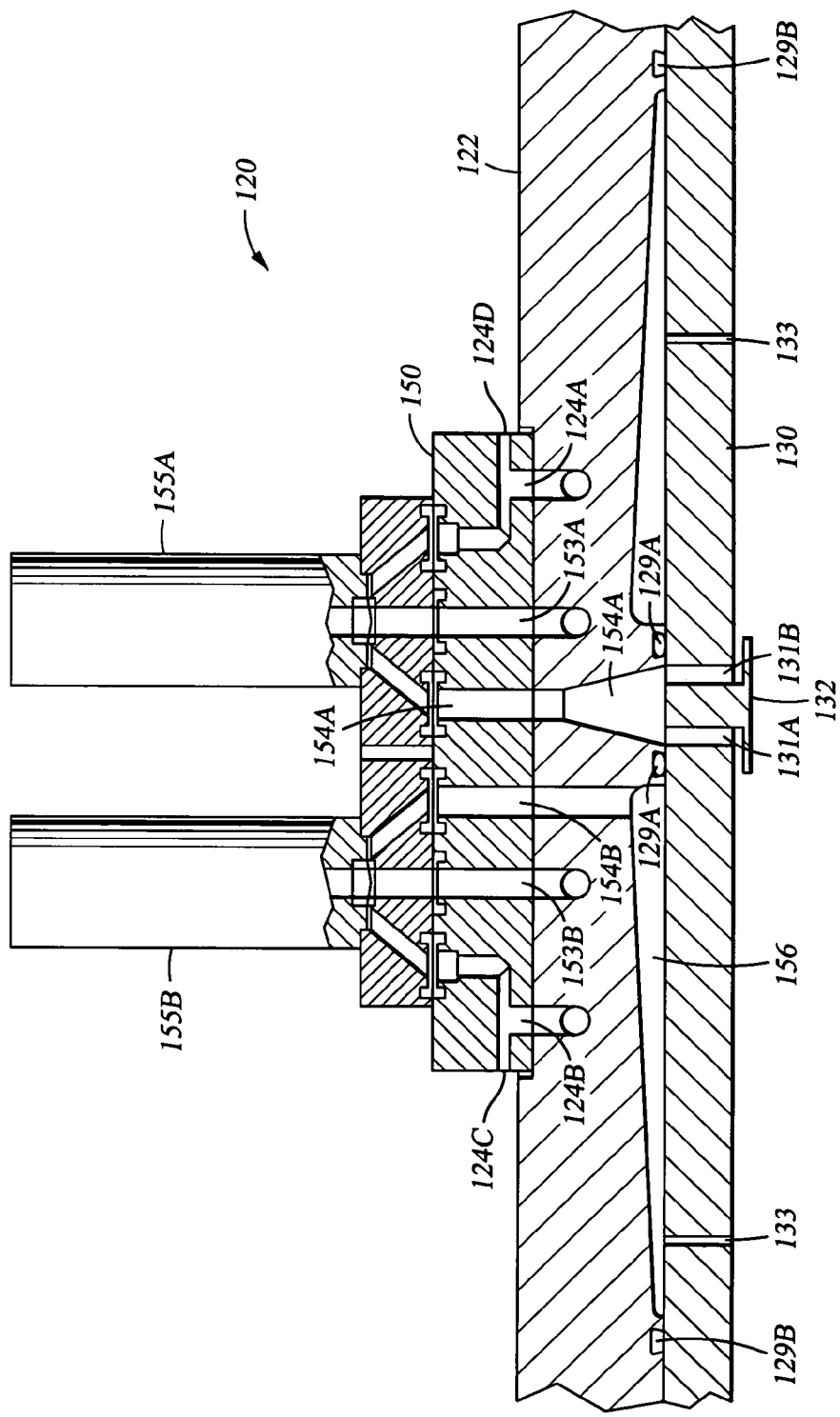
FIG. 1A is a partial cross-sectional view of one embodiment of a lid assembly of the processing system of FIG. 1.
Figure 2:
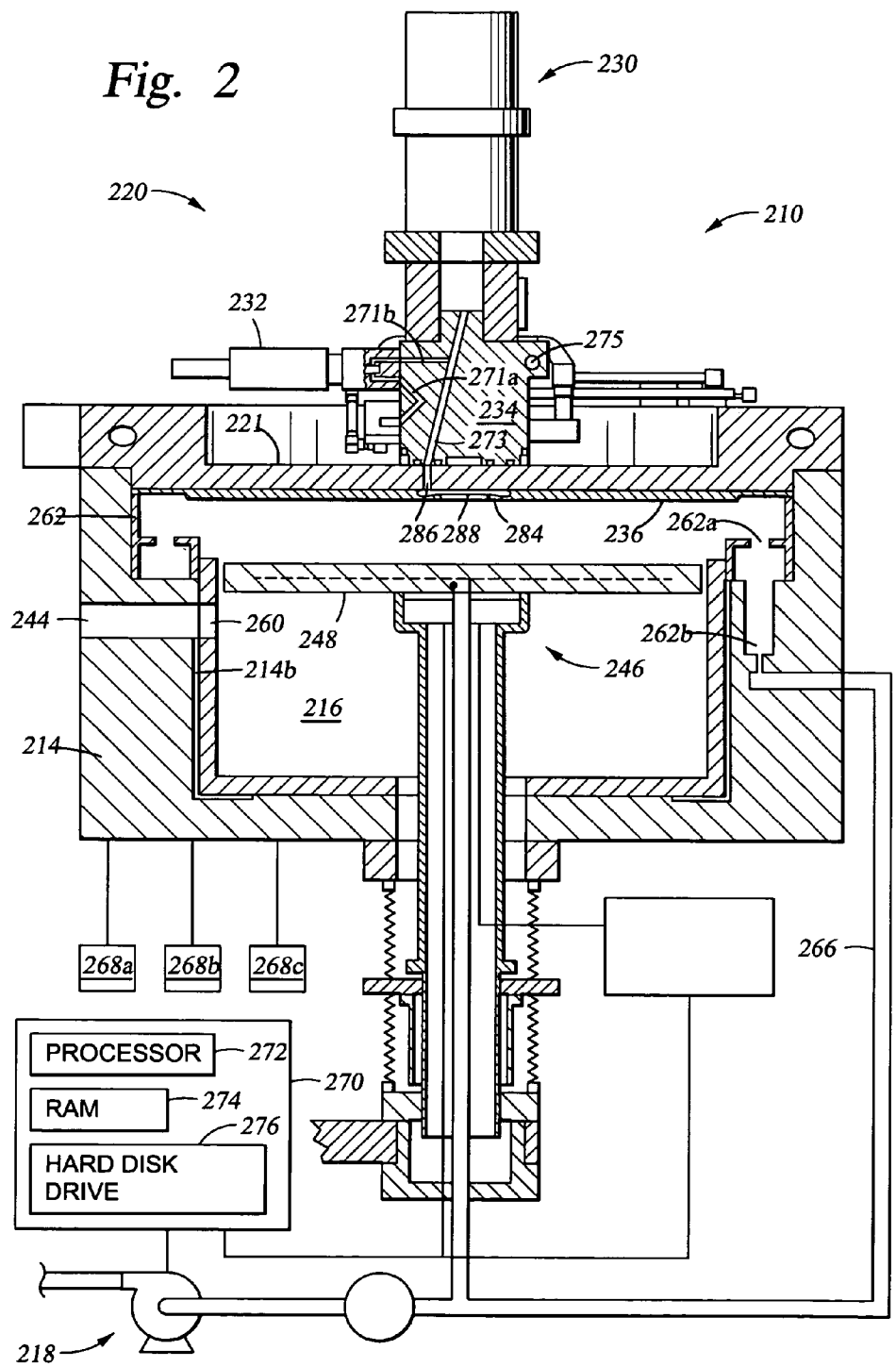
FIG. 2 is a schematic cross-sectional view of another embodiment of a processing system adapted to perform cyclical deposition.

FIGS. 1, 1A, and 2 are drawings of exemplary embodiments of a processing system that may be used to perform cyclical deposition. The term "cyclical deposition" as used herein refers to the sequential introduction of reactants to deposit a thin layer over a structure and includes processing techniques such as atomic layer deposition and rapid sequential chemical vapor deposition. The sequential introduction of reactants may be repeated to deposit a plurality of thin layers to form a layer to a desired thickness. Not wishing to be bound by theory, it is believed that the mode of deposition of cyclical deposition provides conformal coverage over substrate structures.

FIG. 1 is a partial cross-sectional perspective view of one embodiment of a processing system 100. The processing system 100 comprises a lid assembly 120 includes a lid plate 122, a manifold block 150, one or more valves (one valve 155A is shown in FIG. 1), one or more reservoirs 170, and a distribution plate 130. The lid assembly 120 has one or more isolated zones/flow paths to deliver one or more process gases to a workpiece/substrate surface disposed in the processing system 100. The isolated zones/flow paths prevent exposure or contact of the precursor gases within the lid assembly. The term "process gas" is intended to include one or more reactive gas, precursor gas, purge gas, carrier gas, as well as a mixture or mixtures thereof.

The chamber body 105 includes a pumping plate 109, a liner 107, a support pedestal 111, and a slit valve disposed therein. The slit valve is formed within a side wall of the chamber body 105 and allows transfer of a workpiece to and from the interior of the chamber body 105. The support pedestal 111 is disposed within the chamber body 105 and includes a lifting mechanism to position a workpiece, such as a semiconductor wafer for example, therein. The workpeice may be heated, such as by a heated support pedestal 111 or by radiant heat emitted from a secondary source, depending on the requisite process conditions. A purge channel 108 is formed within the liner 107 and is in fluid communication with a pump system to helps evacuate fluids from the chamber body 105. The pumping plate 109 has a plurality of apertures 109A formed there-through and defines an upper surface of the purge channel 108 controlling the flow of fluid between the chamber body 105 and the pumping system.

FIG. 1A is a partial cross-sectional view of the lid assembly 120 of the process system 100 of FIG. 1. As shown, the lid assembly includes two valves 155A,B. The valves 155A,B are preferably high speed actuating valves. The valves 155A,B may precisely and repeatedly deliver short pulses of process gases into the chamber body 105. The valves 155A,B can be directly controlled by a system computer, such as a mainframe for example, or controlled by a chamber/application specific controller, such as a programmable logic computer (PLC). The on/off cycles or pulses of the valves 155 may be less than about 100 msec. In one aspect, the valves 155A,B are three-way valves tied to both a precursor gas source and a continuous purge gas source. Each valve 155A,B meters a precursor gas while a purge gas continuously flows through the valve 155A,B.

Valve 155A receives a first process gas from an inlet precursor gas channel 153A and an inlet purge gas channels 124A and delivers the first process gas through an outlet process gas channel 154A formed through the manifold block 150 and the lid plate 122. The outlet gas channel 154A feeds into the chamber body 105 through centrally located openings 131A, 131B formed in the distribution plate 130. An inner diameter of the gas channel 154A gradually increases within the lid plate 122 to decrease the velocity of the first process gas. A dispersion plate 132 is also disposed adjacent the openings 131A, 131B to prevent the first process gas from impinging directly on the workpiece surface by slowing and re-directing the velocity profile of the flowing gases. Without this re-direction, the force asserted on the workpiece by the first process gas may prevent deposition because the kinetic energy of the impinging first process gas can sweep away reactive molecules already disposed on the workpiece surface.

Valve 155B receives a second process gas from an inlet precursor gas channel 153B and an inlet purge gas channels 124B and delivers the second process gas through an outlet process gas channel 154B formed through the manifold block 150 and the lid plate 122. The outlet gas channel 154B feeds into the chamber body 105 via a cavity 156 in the distribution plate 130 and through apertures 133 formed in the distribution plate 130.

The lid assembly further comprises a third valve similar to valve 155B which receives a third process gases from an inlet precursor gas channel and from an inlet purge channel and deliver the third process gas through an outlet process gas channel formed through the manifold block 150 and the lid plate 122. The outlet gas channel feeds into the chamber body 105 via the cavity 156 in the distribution plate 130 and through the apertures 133 formed in the distribution plate 130. In one aspect, cavity 156 may comprise a plurality of channels separating the second process gas and the third process gas.

Referring to FIG. 1, one or more fluid delivery conduits 126 (only one delivery conduit 126 is shown) are preferably disposed about a perimeter of the chamber body 105 to carry the one or more process gases from their respective source to the lid assembly 120. Each fluid delivery conduit 126 is connectable to a fluid source at a first end thereof and has an opening/port 192A at a second end thereof. The opening 192A is connectable to a respective receiving port 192B disposed on a lower surface of the lid plate 122. The receiving port 192B is formed on a first end of a fluid channel 123 that is formed within the lid plate 122. A fluid may flow from the fluid delivery conduit 126, through the ports 192A and 192B, to the fluid channel 123. This connection facilitates the delivery of a fluid from its source, through the lid plate assembly 120, and ultimately within the chamber body 105.

The one or more reservoirs 170 may be in fluid communication between a fluid source and the valves 155. The reservoirs 170 provide bulk fluid delivery to the respective valves 155 to insure a required fluid volume is always available to the valves 155. Preferably, the lid assembly 120 includes at least one reservoir 170 for each process gas. Each reservoir 170 contains between about 2 times the required volume and about 20 times the required volume of a fluid delivery cycle provided by the valves 155.

In operation, a workpiece, such as a semiconductor wafer for example, is inserted into the chamber body 105 through the slit valve and disposed on the support pedestal 111. The support pedestal 111 is lifted to a processing position within the chamber body 105. Each precursor gas flows from its source through its fluid delivery conduit 126 into its designated fluid channel 123, into its designated reservoir 170, through the manifold block 150, through its designated valve 155, back through the manifold block 150, through the lid plate 122, and through the distribution plate 130. A purge gas, such as argon, helium, hydrogen, nitrogen, or mixtures thereof, for example, is allowed to flow and continuously flows during the deposition process. The purge gas flows through its fluid delivery conduit 126 to its designated fluid channel 123, through the manifold block 150, through its designated valve 155, back through the manifold block 150, through the lid plate 122, through the distribution plate 130, and into the chamber body 105. A separate purge gas channel may be provided for each of the valves 155 because the flow rate of the purge gas is dependent on the differing flow rates of the precursor gases.

More particularly, a first purge gas and a first reactant gas flows through the slotted openings 131A, 131B (FIG. 1A) formed in the dispersion plate 130; a second purge gas and a second reactant flows through the apertures 133 formed in the dispersion plate 130; and a third purge gas and a third reactant flows through the apertures 133 formed in the dispersion plate 130. As explained above, the flow path through the slotted openings 131A, 131B and the flow path through the apertures 133 are isolated from one another. The first purge gas and first precursor gas flowing through the slotted openings 131A, 131B are deflected by the dispersion plate 132. The dispersion plate 132 converts the substantially downward, vertical flow profile of the gases into an at least partially horizontal flow profile. The processing system 100 as described in FIGS. 1 and 1A is more fully described in commonly assigned U.S. Patent Publication No. 2003/011608, entitled "Chamber Hardware Design For Titanium Nitride Atomic Layer Deposition," by Nguyen et al., filed on Dec. 21, 2001 and published on Jun. 6, 2003, which is incorporated by reference in its entirety to the extent not inconsistent with the present disclosure.

FIG. 2 is a schematic cross-sectional view of another embodiment of a processing system 210 that may be used to perform cyclical deposition. The processing system 210 includes a housing 214 defining a processing chamber 216 with a slit valve opening 244 and a vacuum lid assembly 220. Slit valve opening 244 allows transfer of a wafer (not shown) between processing chamber 216 and the exterior of system 210. Any conventional wafer transfer device may achieve the aforementioned transfer.

The vacuum lid assembly 220 includes a lid 221 and a process fluid injection assembly 230 to deliver reactive (i.e., precursor, reductant, oxidant), carrier, purge, cleaning and/or other fluids into the processing chamber 216. The fluid injection assembly 230 includes a gas manifold 234 mounting a plurality of control valves 232 (one is shown in FIG. 2), and a baffle plate 236. Programmable logic controllers may be coupled to the control valves 232 to provide sequencing control of the valves. Valves 232 provide rapid gas flows with valve open and close cycles of less than about one second, and in one embodiment, of less than about 0.1 second. In one embodiment, the valves 232 are surface mounted, electronically controlled valves, such as electronically controlled valves available from Fujikin of Japan as part number FR-21-6.35 UGF-APD. Other valves that operate at substantially the same speed may also be used.

The lid assembly 220 may further include one or more gas reservoirs (not shown) which are fluidly connected between one or more process gas sources (such as vaporized precursor sources) and the gas manifold 234. The gas reservoirs may provide bulk gas delivery proximate to each of the valves 232. The reservoirs are sized to insure that an adequate gas volume is available proximate to the valves 232 during each cycle of the valves 232 during processing to minimize time required for fluid delivery thereby shortening sequential deposition cycles. For example, the reservoirs may be about 5 times the volume required in each gas delivery cycle.

The vacuum lid assembly 220 may include one or more valves, such as four valves 232. Three of the valves 232 are fluidly coupled to three separate reactant gas sources. One of the valves 232 is fluidly coupled to a purge gas source. Each valve 232 is fluidly coupled to a separate trio of gas channels 271a, 271b, 273 (one trio is shown in FIG. 2) of the gas manifold 234. Gas channel 271a provides passage of gases through the gas manifold 234 to the valves 232. Gas channel 271b delivers gases from the valves 232 through the gas manifold 234 and into a gas channel 273. Channel 273 is fluidly coupled to a respective inlet passage 286 disposed through the lid 221. Gases flowing through the inlet passages 286 flow into a plenum or region 288 defined between the lid 221 and the baffle plate 236 before entering the chamber 216. The baffle plate 236 is utilized to prevent gases injected into the chamber 216 from blowing off gases adsorbed onto the surface of the substrate. The baffle plate 236 may include a mixing lip 284 to re-direct gases toward the center of the plenum 288 and into the process chamber 216.

Disposed within processing chamber 216 is a heater/lift assembly 246 that includes a wafer support pedestal 248. The heater/lift assembly 246 may be moved vertically within the chamber 216 so that a distance between support pedestal 248 and vacuum lid assembly 220 may be controlled. The support pedestal may include an embedded heater element, such as a resistive heater element or heat transfer fluid, utilized to control the temperature thereof. Optionally, a substrate disposed on the support pedestal 248 may be heated using radiant heat. The support pedestal 248 may also be configured to hold a substrate thereon, such as by a vacuum chuck, by an electrostatic chuck, or by a clamp ring.

Disposed along the side walls 214b of the chamber 216 proximate the lid assembly 220 is a pumping channel 262. The pumping channel 262 is coupled by a conduit 266 to a pump system 218 which controls the amount of flow from the processing chamber 216. A plurality of supplies 268a, 268b and 268c of process and/or other fluids, are in fluid communication with one of valves 232 through a sequence of conduits (not shown) formed through the housing 214, lid assembly 220, and gas manifold 234. The processing system 210 may include a controller 270 which regulates the operations of the various components of system 210. The processing system 210 as described in FIG. 2 is more fully described in commonly assigned U.S. patent application Ser. No. 10/016,300, entitled "Lid Assembly For A Processing System To Facilitate Sequential Deposition Techniques," by Tzu et al., filed on Dec. 12, 2001 and issued as U.S. Pat. No. 6,878,206 on Apr. 12, 2005, which claims priority to U.S. Provisional Patent Application Ser. No. 60/305,970, filed on Jul. 16, 2001, which are both incorporated by reference in their entirety to the extent not inconsistent with the present disclosure.

Other processing systems may also be used to perform cyclical deposition. For example, another processing system which may also be used is the processing system disclosed in commonly assigned U.S. patent application Ser. No. 10/032,284, entitled "Gas Delivery Apparatus and Method For Atomic Layer Deposition," filed on Dec. 21, 2001 and published as U.S. Patent Publication No. 2003/0079686 on May 1, 2003, which claims priority to U.S. Provisional Patent Application Ser. No. 60/346,086, entitled "Method and Apparatus for Atomic Layer Deposition," filed on Oct. 26, 2001, which are both incorporated by reference in their entirety to the extent not inconsistent with the present disclosure.

Deposition Processes

Processing system 100 as described in FIGS. 1 and 1A and processing system 210 as described in FIG. 2 may be used to implement the following exemplary process for cyclical deposition utilizing three or more precursors. It should also be understood that the following processes may be performed in other chambers as well, such as batch processing systems.

Figure 3A:
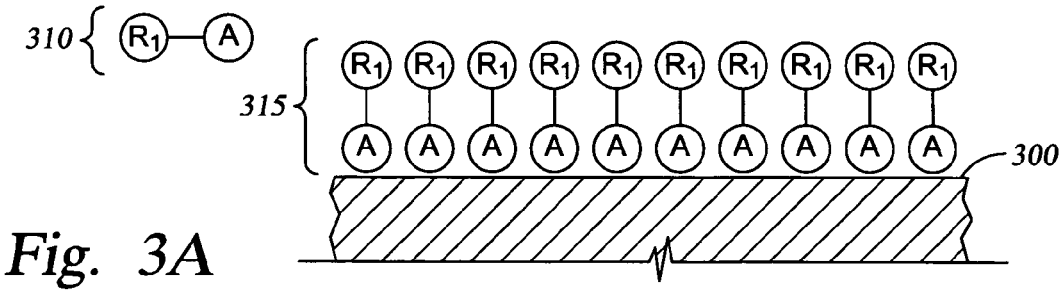
FIGS. 3A-C are simplified cross-sectional views illustrating one embodiment of exposing a substrate structure to three precursors in which delivery of two of the three precursors at least partially overlap.
Figure 3B:
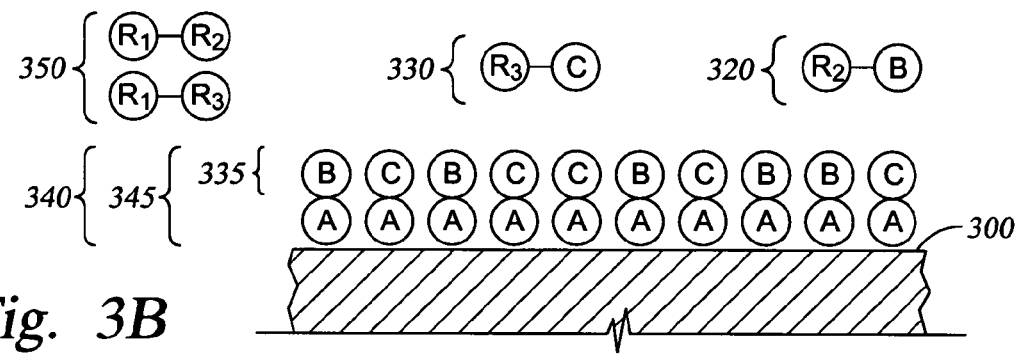
Figure 3C:
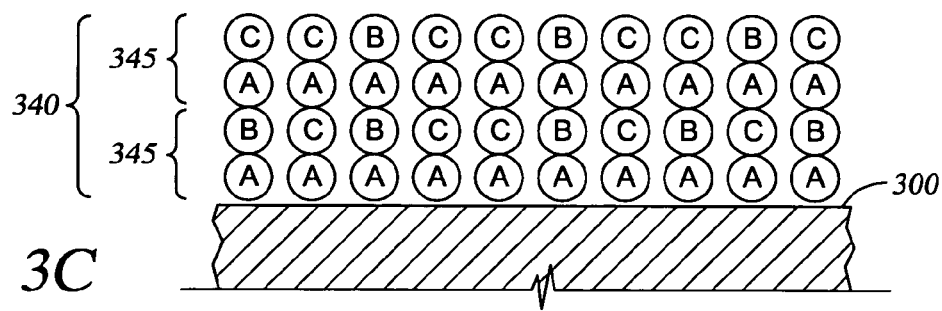

One embodiment of the present method involves cyclical deposition of a ternary material layer by delivering three precursors to a substrate in which delivery of two of the three precursors at least partially overlap. The term "ternary material" as used herein is defined as a material comprising three major elements. The composition and structure of precursors on a surface during cyclical deposition is not precisely known. Not wishing to be bound by theory, FIGS. 3A-C are simplified cross-sectional views illustrating one embodiment of exposing the substrate structure 300 to three precursors in which delivery of two of the three precursors at least partially overlap. The substrate structure 300 refers to any workpiece upon which film processing is performed and may be used to denote a substrate, such as a semiconductor substrate or a glass substrate, as well as other material layers formed on the substrate, such as a dielectric layer or other layers.

In FIG. 3A, a first precursor 310 is adsorbed on the substrate structure 300 by introducing a pulse of the first precursor 310 into a process chamber, such as process chamber 100 shown in FIGS. 1 and 1A and such as process chamber 210 shown in FIGS. 2. The first precursor 310 may comprise atoms of an element (labeled as A) with one or more reactive species (labeled as $R_1$). The first precursor may be provided with or without the aid of a carrier gas. Examples of carrier gases which may be used include, but are not limited to, helium (He), argon (Ar), nitrogen ($N_2$), hydrogen ($H_2$), and mixtures thereof. It is believed that a layer 315, which may be about a monolayer or may be more or less than a monolayer, of the first precursor 310 may be adsorbed onto the surface of the substrate structure 300 during a given pulse. Any of the first precursor 310 not adsorbed will flow out of the chamber as a result of the vacuum system, carrier gas flow, and/or purge gas flow. The terms "adsorption" or "adsorb" as used herein are defined to include chemisorption, physisorption, or any attractive and/or bonding forces which may be at work and/or which may contribute to the bonding, reaction, adherence, or occupation of a portion of an exposed surface of a substrate structure.

After the pulse of the first precursor 310 is introduced into the chamber, a purge gas is introduced. Examples of purge gases which may be used include, but are not limited to, helium (He), argon (Ar), nitrogen ($N_2$), hydrogen ($H_2$), and mixtures thereof. The purge gas may be provided as a pulse or may be provided as a continuous flow into the chamber. The purge gas and the carrier gas may comprise different gas flows or may comprise the same gas flow. If the purge gas and the carrier gas comprise different gas flows, the purge gas and the carrier gas preferably comprise the same type of gas.

Referring to FIG. 3B, after a purge gas has been introduced, a pulse of a second precursor 320 and a pulse of a third precursor 330 are introduced into the process chamber. The second precursor 320 may comprise atoms of an element (labeled as B) with one or more reactive species (labeled as $R_2$) and the third precursor 330 may comprise atoms of an element (labeled as C) with one or more reactive species (labeled as $R_3$). The second precursor 320 and the third precursor 330 may be provided with or without the aid of a carrier gas. Examples of carrier gases which may be used include, but are not limited to, helium (He), argon (Ar), nitrogen ($N_2$), and hydrogen ($H_2$), and mixtures thereof.

It is believed, that the second precursor 320 and the third precursor 330 compete with one another to adsorb onto and to react with the first precursor 310. The reaction of the first precursor 310 with the second precursor 320 and the reaction of the first precursor 310 with the third precursor 330 forms a ternary compound 340 comprising element A, element B, and element C and forms by-products 350. The amount of the second precursor 320 reacting with the first precursor 310 in comparison to the amount of the third precursor 330 reacting with the first precursor 310 depends, along with other factors discussed herein, on the ratio of the second precursor versus the third precursor introduced into the chamber. Therefore, a layer 335, which may be about a monolayer or may be more or less than a monolayer, of the combination of the second precursor 320 and the third precursor 330 may adsorb on the first precursor 310 and a monolayer 345 or less of the ternary compound 340 may form during one cycle. Therefore, sequential delivery of pulses of a first precursor, a second precursor, and a third precursor, in which pulses of the second precursor and the third precursor at least partially overlap in time, is believed to result in the alternating adsorption of a layer of a first precursor and of a layer of a second precursor and a third precursor to form a layer of a ternary material.

After a pulse of the second precursor 320 and the third precursor 330, a purge gas is introduced. Thereafter, as shown in FIG. 3C, the cycle of delivering three precursors to the substrate structure 300 may be repeated, if necessary, until a desired thickness of the ternary material 340 is achieved. In general, the composition of the ternary material 340 may be represented by the following expression $AB_XC_Y$ in which the atomic ratio of element A to element B to element C is 1 to X to Y in which X and Y may be any fraction including whole numbers, or mixed numbers.

In FIGS. 3A-3C, formation of the ternary material layer is depicted as starting with the adsorption of a layer of the first precursor 310 on the substrate structure 300 followed by a layer of the combination of the second precursor 320 and the third precursor 330. Alternatively, formation of the ternary material layer may start with the adsorption of a layer of the combination of the second precursor 320 and the third precursor 330 on the substrate structure 300 followed by adsorption of a layer of the first precursor 310. In another theory, the precursors may be in an intermediate state when on a surface of the substrate. In addition, the deposited ternary compound 340 may also contain more than simply element A, element B, and element C due to other elements and/or by-products incorporated into the film. Furthermore, one or more of the precursors may be plasma enhanced. However, the second precursor 320 and the third precursor 330 are preferably introduced without a plasma to reduce the likelihood of co-reaction between the second precursor 320 and the third precursor 330.

The amount of element B and the amount of element C in the ternary material may be varied by adjusting one or more variety of parameters. For example, the flow ratio of element B to element C between cycles may be varied. The flow ratio of element B to element C is not necessarily a one-to-one relationship of the amount of element B and element C incorporated into the ternary material. Other parameters which may affect incorporation of element B and element C in the ternary material include the substrate heater temperature, the pressure, and the amount and sequence of the overlap of element B to element C. Furthermore, the composition of the ternary material layer may be tuned so that the ternary material layer may comprise varying amounts of the three elements at a certain through the depth of the ternary material layer which is described in further detail elsewhere herein.

Preferably, there is a co-reaction of the first precursor 310 with the second precursor 320 and a co-reaction of the first precursor 310 with the third precursor 330 with a limited or no co-reaction of the second precursor 320 with the third precursor 330 to limit gas phase reactions between the second precursor 320 and the third precursor 330. Because of the highly reactive nature of precursors containing halogens, such as metal halides and derivatives thereof, the second precursor 320 and the third precursor 330 preferably do not comprise halogens to reduce the likelihood of gas phase reactions between the second precursor 320 and the third precursor 330. The deposition of the ternary compound may proceed by sequential delivery of a first precursor, a second precursor, and a third precursor, in which pulses of the second precursor and the third precursor at least partially overlap in time, to the substrate structure 300. The second precursor and the third precursor may be introduced through the chamber lid assembly through separate flow paths by separate valves or may be introduced through the chamber lid assembly through the same flow path by the same valve or separate valves. Preferably, the second precursor and the third precursor are introduced into the chamber by separate valves in fluid communication with separate flow paths through the chamber lid assembly.

Figure 4A:
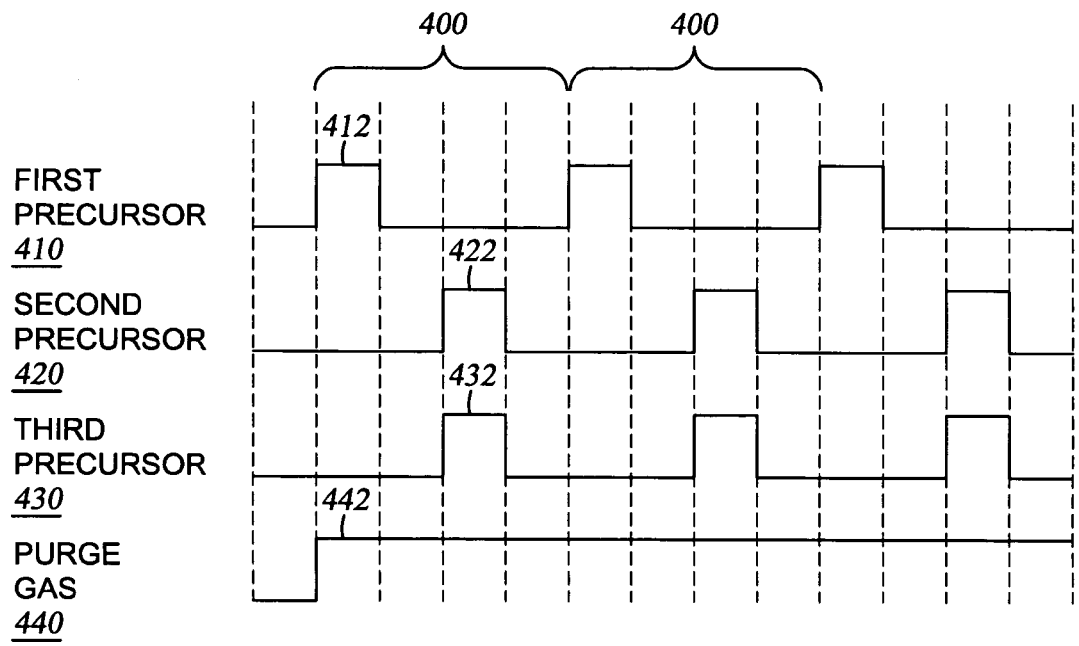
FIGS. 4A-4D and 4F are graphs of exemplary processes of sequential delivery of pulses of a first precursor, a second precursor, and a third precursor, in which the pulses of the second precursor and the third precursor at least partially overlap.

FIG. 4A is a graph of an exemplary process of sequential delivery of a first precursor, a second precursor, and a third precursor, in which pulses of the second precursor and the third precursor at least partially overlap in time. One cycle 400 comprises providing a continuous flow 442 of a purge gas 440 to the chamber. During the continuous flow 442 of the purge gas 440, a pulse 412 of a first precursor 410 is introduced into the chamber and dosed into the stream of the continuous flow 442 of the purge gas 440 by opening and closing a valve providing the first precursor. After the pulse 412 of the first precursor 410, the flow 442 of the purge gas 440 continues into the chamber without any precursor introduced into the chamber. Then, during the continuous flow 442 of the purge gas 440, a pulse 422 of a second precursor 420 and a pulse 432 of a third precursor 430 are introduced simultaneously into the chamber and dosed into the stream of the continuous flow 442 of the purge gas 440 by opening a valve providing the second precursor and a valve providing the third precursor substantially at the same time and, then, by closing the valve providing the second precursor and the valve providing the third precursor substantially at the same. After the pulse 422 of the second precursor 420 and the pulse 432 of the third precursor 430, the flow 442 of the purge gas 440 continues into the chamber without any precursors introduced into the chamber. The cycle 400 may be repeated to deposit a desired thickness of the ternary material layer.

Figure 4B:
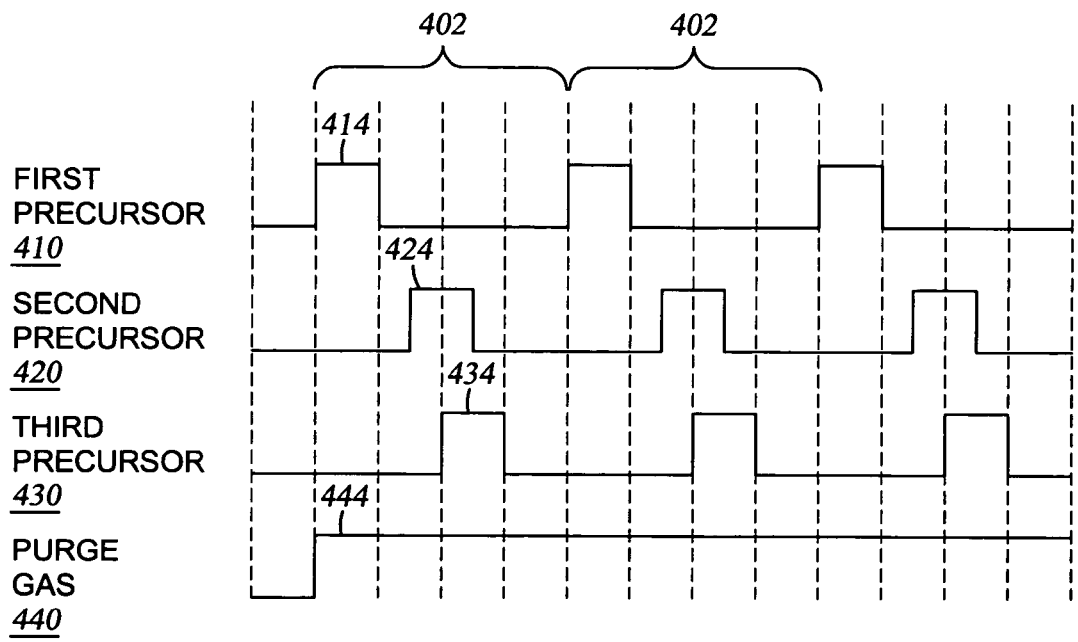

FIG. 4B is a graph of another exemplary process of sequential delivery of a first precursor, a second precursor, and a third precursor, in which pulses of the second precursor and the third precursor at least partially overlap in time. One cycle 402 comprises providing a continuous flow 444 of a purge gas 440 to the chamber. During the continuous flow 444 of the purge gas 440, a pulse 414 of a first precursor 410 is introduced into the chamber and dosed into the stream of the continuous flow 444 of the purge gas 440 by opening and closing a valve providing the first precursor. After the pulse 414 of the first precursor 410, the flow 444 of the purge gas 440 continues into the chamber without any precursors introduced into the chamber. Then, during the continuous flow 444 of the purge gas 440, a pulse 424 of a second precursor 420 is introduced into the chamber and dosed into the stream of the continuous flow 444 of the purge gas 440 by opening a valve providing the second precursor. Prior to the end of the pulse 424 of the second precursor 420, a pulse 434 of a third precursor is introduced into the chamber and dosed into the stream of the continuous flow 444 of the purge gas 440 by opening a valve providing the third precursor. Then, the valve providing the second precursor is closed followed by closing the valve providing the third precursor. After the pulse 434 of the third precursor 430, the flow 444 of the purge gas 440 continues into the chamber without any precursors introduced into the chamber. The cycle 402 may be repeated to deposit a desired thickness of the ternary material layer.

Figure 4C:
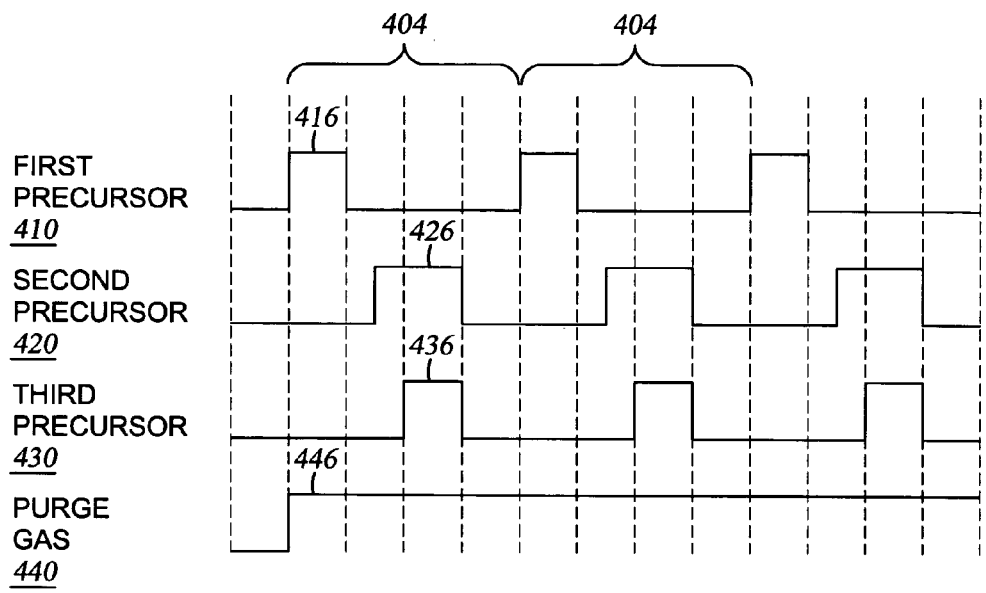

FIG. 4C is a graph of still another exemplary process of s sequential delivery of a first precursor, a second precursor, and a third precursor, in which pulses of the second precursor and the third precursor at least partially overlap in time. One cycle 404 comprises providing a continuous flow 446 of a purge gas 440 to the chamber. During the continuous flow 446 of the purge gas 440, a pulse 416 of a first precursor 410 is introduced into the chamber and dosed into the stream of the continuous flow 446 of the purge gas 440 by opening and closing a valve providing the first precursor. After the pulse 416 of the first precursor 410, the flow 446 of the purge gas 440 continues into the chamber without any precursors introduced into the chamber. Then, during the continuous flow 446 of the purge gas 440, a pulse 426 of a second precursor 420 is bled into the chamber prior to a pulse 436 of a third precursor 430 and dosed into the stream of the continuous flow 446 of the purge gas 440 by opening a valve providing the second precursor. The pulse 436 of the third precursor 430 is then introduced into the chamber and dosed into the stream of the continuous flow 446 of the purge gas 440 by opening a valve providing the third precursor. Then, the valve providing the second precursor and the valve providing the third precursor are closed substantially at the same time. After the pulse 426 of the second precursor 420 and the pulse 436 of the third precursor 430, the flow 446 of the purge gas 440 continues into the chamber without any precursors introduced into the chamber. The cycle 404 may be repeated to deposit a desired thickness of the ternary material layer.

Figure 4D:
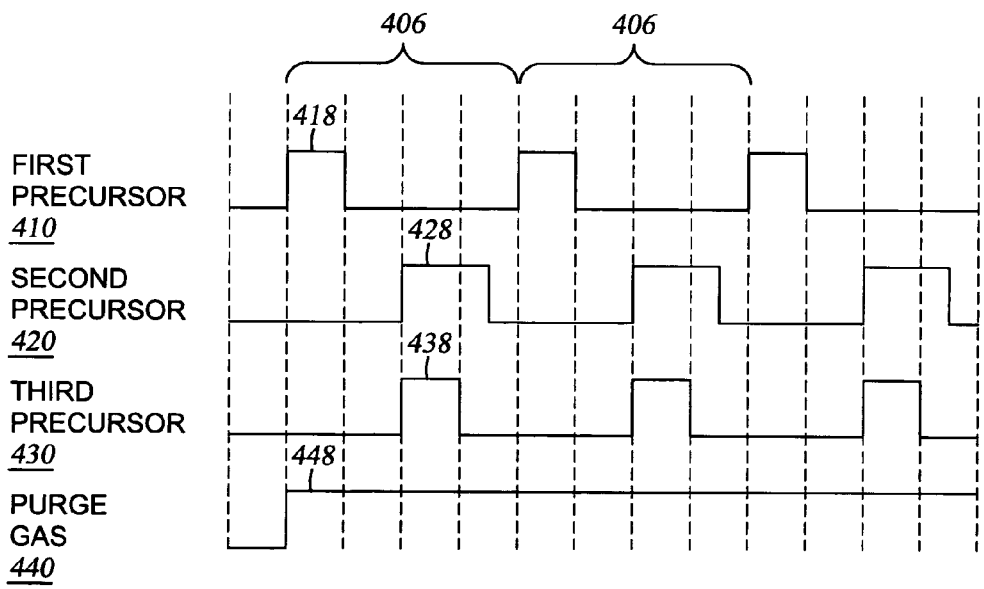

FIG. 4D is a graph of still another exemplary process of sequential delivery of a first precursor, a second precursor, and a third precursor, in which pulses of the second precursor and the third precursor at least partially overlap in time. One cycle 406 of sequential delivery comprises providing a continuous flow 448 of a purge gas 440 to the chamber. During the continuous flow 448 of the purge gas 440, a pulse 418 of a first precursor 410 is introduced into the chamber and dosed into the stream of the continuous flow 448 of the purge gas 440 by opening and closing a valve providing the first precursor. After the pulse 418 of the first precursor 410, the flow 448 of the purge gas 440 continues into the chamber without any precursors introduced into the chamber. Then, during the continuous flow 448 of the purge gas 440, a pulse 428 of a second precursor 420 and a pulse 438 of a third precursor 430 are introduced simultaneously into the chamber and dosed into the stream of the continuous flow 448 of the purge gas 440 by opening a valve providing the second precursor and a valve providing the third precursor substantially at the same. The pulse 428 of the second precursor 420 is dragged behind the pulse 438 of the third precursor 430 by closing the valve providing the third precursor prior to closing the valve providing the second precursor. After the pulse 428 of the third precursor 420, the flow 448 of the purge gas 440 continues into the chamber without any precursors introduced into the chamber. The cycle 406 may be repeated to deposit a desired thickness of the ternary material layer.

Figure 4E:
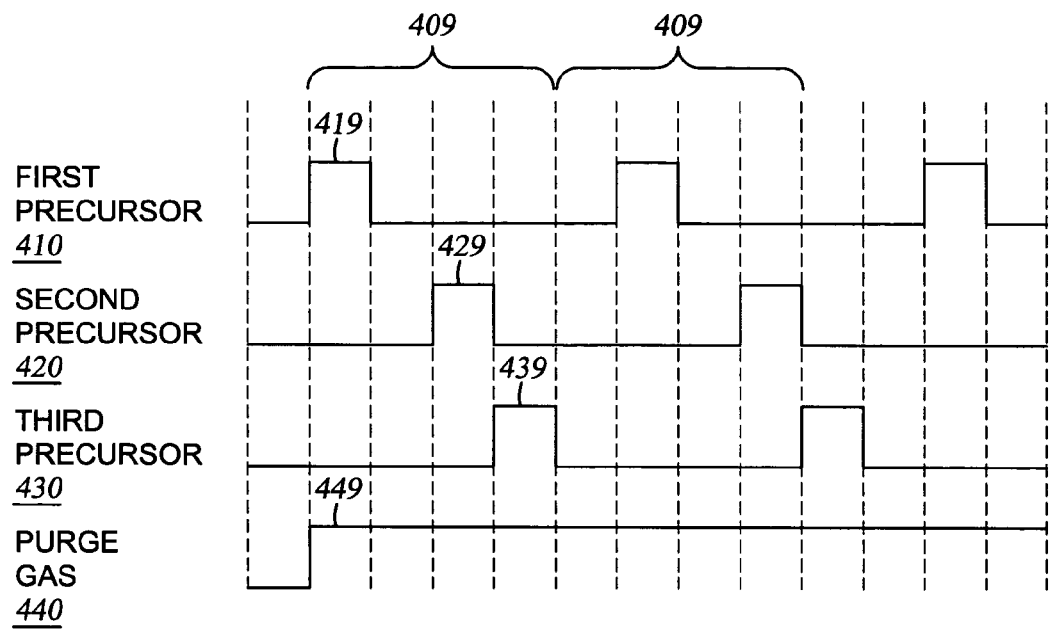
FIG. 4E is a graph of one exemplary process of sequentially delivering a first precursor, a second precursor, and a third precursor in which there is no purge gas which separates the flow of the second precursor and the third precursor.

FIG. 4E is a graph of still another exemplary process of sequentially delivering a first precursor and delivering a second precursor and a third precursor within the scope of the present invention. One cycle 409 comprises providing a continuous flow 449 of a purge gas 440 to the chamber. During the continuous flow 449 of the purge gas 440, a pulse 419 of a first precursor 410 is introduced into the chamber and dosed into the stream of the continuous flow 449 of the purge gas 440 by opening and closing a valve providing the first precursor. After the pulse 419 of the first precursor 410, the flow 449 of the purge gas 440 continues into the chamber without any precursors introduced into the chamber. Then, during the continuous flow 449 of the purge gas 440, a pulse 429 of a second precursor 420 is introduced into the chamber and dosed into the stream of the continuous flow 449 of the purge gas 440 by opening a valve providing the second precursor. At the end of the pulse 429 of the second precursor, a pulse 439 of a third precursor 430 is introduced into the chamber and dosed into the stream of the continuous flow 448 of the purge gas 440 by closing a valve providing the second precursor and by opening a valve providing the third precursor substantially at the same time. Then, the valve providing the third precursor is closed. After the pulse 439 of the third precursor 430, the flow 449 of the purge gas 440 continues into the chamber without any precursors introduced into the chamber. The cycle 409 may be repeated to deposit a desired thickness of the ternary material layer.

Referring to FIG. 4A, in one embodiment, the pulse 412 of the first precursor 410 is evacuated from a processing zone adjacent the substrate prior to introduction of the pulse 422 of the second precursor 420 and the pulse 432 of the third precursor 430. In another embodiment, the pulse 412 of the first precursor 410 along with the pulse 422 of the second precursor 420 and the pulse 432 of the third precursor 430 may be present at the same time in a processing zone adjacent the substrate in which the pulse 412 of the first precursor 410 is at one portion of the substrate and the pulse 422 of the second precursor 420 and the pulse 432 of the third precursor 430 are at another portion of the substrate. Similarly in reference to FIGS. 4B-4E, the pulse of the first precursor and the pulses of the second and third precursors may be present in the processing zone separately or may be present in the processing zone together with the pulse of the first precursor at one portion of the substrate and the pulse of the second precursor and the third precursor at another portion of the substrate.

FIGS. 4A-4D are graphs of exemplary processes of sequential delivery of a first precursor, a second precursor, and a third precursor, in which pulses of the second precursor and the third precursor at least partially overlap in time. Other embodiments of sequential delivery of a first precursor, a second precursor, and a third precursor, in which pulses of the second precursor and the third precursor at least partially overlap in time, are within the scope of the present disclosure. Not wishing to be bound by theory, it is believed sequential delivery of a first precursor, a second precursor, and a third precursor, in which pulses of the second precursor and the third precursor at least partially overlap in time, may provide a true ternary material layer comprising layers containing at the atomic level elements of the first precursor, the second precursor, and the third precursor. Not wishing to be bound by theory, it is believed that for sequential introduction of three precursors in which the pulses do not overlap in time (i.e., a first precursor, followed by the second precursor, followed by the third precursor or first precursor, followed by the second precursor, followed by the first precursor, followed by the third precursor), it is uncertain whether there is formation of a layer comprising amounts of elements A, B, and C. It is also believed that delivering pulses of a second precursor and a third precursor, in which the pulses of the second precursor and the third precursor at least partially overlap in time, aids in reducing the amount of precursor impurities incorporated into the deposited film due to the competitive nature of the second precursor versus the third precursor for the first precursor. In another aspect, cyclical deposition of a ternary material of three elements by exposing the substrate to three precursors in which the delivery of pulses of two of the three precursors at least partially overlap increases the throughput of cyclical deposition in comparison to a sequential introduction of the three precursors without any overlap of the pulses.

FIG. 4E is a graph of one exemplary process of sequentially delivering a first precursor, a second precursor, and a third precursor in which there is no purge gas which separates the flow of the second precursor and the third precursor. Not wishing to be bound by theory, although pulses of the second precursor and the third precursor do not overlap, it is believed that sequentially delivering a first precursor, a second precursor, and a third precursor in which there is no purge gas which separates the flow of the second precursor and the third precursor may provide conformal growth of a ternary material layer with improved throughput in comparison to prior processes of sequentially introducing multiple precursors. Other embodiments of sequentially delivering three or more precursors in which at least two of the precursors are not separated by a flow of a purge gas are possible.

Figure 4F:
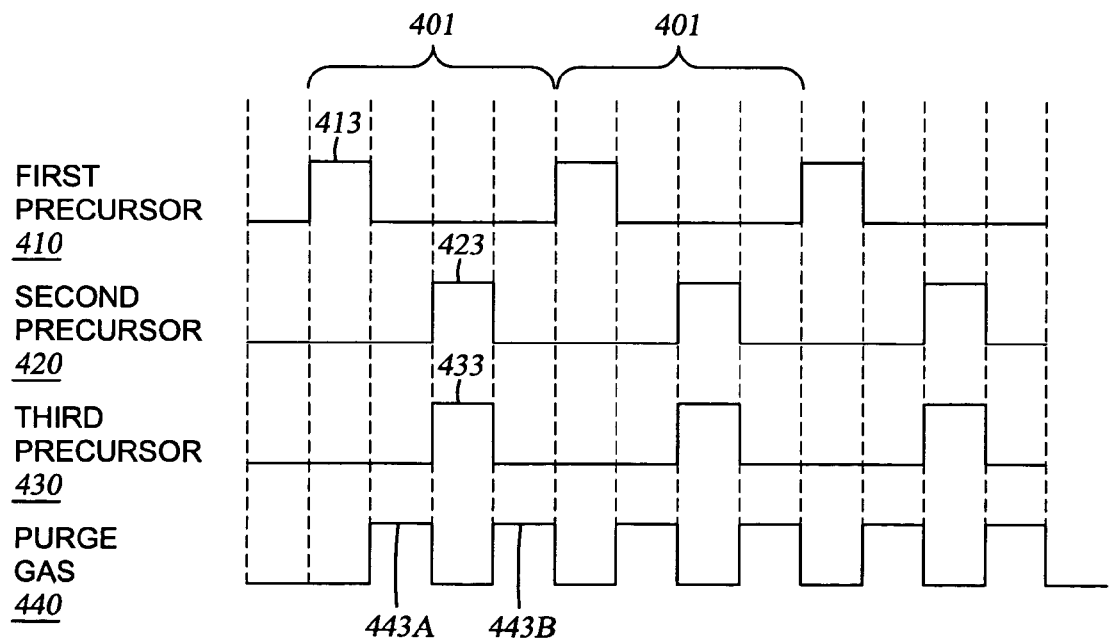

The processes as described in reference to FIG. 4A-4E comprise providing a continuous purge gas. The processes as disclosed herein may also comprise providing a purge gas in pulses. For example, FIG. 4F is a graph of an exemplary process similar to the process as described in FIG. 4A in which the purge gas is provided in pulses. One cycle 401 of sequential delivery of a first precursor, a second precursor, and a third precursor, in which pulses of the second precursor and the third precursor at least partially overlap in time comprises introducing a pulse 413 of a first precursor 410 into the chamber by opening and closing a valve providing the first precursor. After the pulse 413 of the first precursor 410, a pulse 443A of a purge gas 440 is introduced into the chamber by opening and closing a valve providing the purge gas. After the pulse 443A of the purge gas 440, a pulse 423 of a second precursor 420 and a pulse 433 of a third precursor 430 are introduced simultaneously into the chamber by opening a valve providing the second precursor and a valve providing the third precursor substantially at the same time and, then, by closing the valve providing the second precursor and the valve providing the third precursor substantially at the same. After the pulse 423 of the second precursor 420 and the pulse 433 of the third precursor 430, another pulse 443B of the purge gas 440 is introduced into the chamber by opening and closing the valve providing the purge gas. The cycle 401 may be repeated to deposit a desired thickness of the ternary material layer. In other embodiments, introduction of the pulses of the purge gas may overlap with the pulses of the precursors.

FIGS. 4A-4F show each cycle starting with delivery of a pulse of a first precursor followed by delivery of a pulse of a second precursor and a pulse of a third precursor. Alternatively, formation of a ternary material layer may start with the delivery of a pulse of a second precursor and a pulse of a third precursor followed by a pulse of a first precursor. FIGS. 2A-2F show the duration of pulses of precursors and/or a purge gas provided over a relative length of time. In other embodiments, other relative lengths of time are possible for the duration of the pulses. In addition, FIGS. 4A-4E show introducing a pulse of a first precursor and providing a continuous flow of a purge gas in which the continuous flow is started at the same time as the pulse of a first precursor. In other embodiments, a continuous flow of a purge gas may be established prior to any precursor being introduced.

In one embodiment, the flow ratio of pulses of the precursors may be provided at a first ratio during initial cycles to form a first sub-layer having a first composition and the pulses of the precursor may be provided at a second ratio during final cycles to form a sub-layer having a second composition. For example, the flow ratio of the second precursor 420 (FIG. 4) and the third precursor 430 (FIG. 4) may be varied to tune the composition of the ternary material layer. In another embodiment, the pulses of the precursors may be provided at a first sequence during initial cycles to form a first sub-layer having a first composition and the pulses of the precursors may be provided at a second sequence during later cycles to form a second sub-layer.

Figure 5:
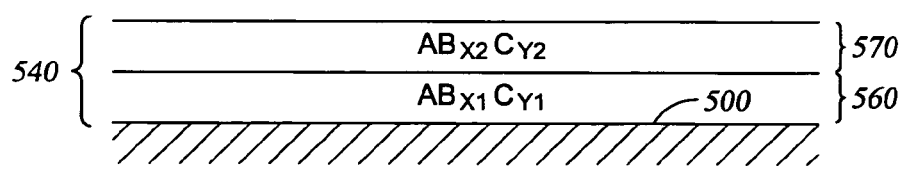
FIG. 5 is a schematic cross-sectional view of one example of tuning the composition of a ternary material layer.

FIG. 5 is a schematic cross-sectional view of one example of tuning the composition of a ternary material layer 540. For example, initial cycles may comprise pulsing in the second precursor and the third precursor in which the pulses comprise a ratio of the second precursor to the third precursor to deposit a bottom sub-layer 560 with the composition of $AB_{X1}C_{Y1}$ over a substrate structure 500. Then, final cycles may comprise pulsing in the second precursor and the third precursor in which the ratio of the second precursor to the third precursor is increased to deposit a top sub-layer 570 with the composition of $AB_{X2}C_{Y2}$ in which X2>X1. Thus, a ternary material layer 540 comprising a bottom sub-layer ($AB_{X1}C_{Y1}$) 560 and a top sub-layer ($AB_{X2}C_{Y2}$) 570 in which X2>X1 is formed. The ternary material layer 540 may be tuned to more or less than two different sub-layers and may be tuned to any ratio of element A to element B to element C for each of these sub-layers as desired for a particular application. For example, the second precursor and the third precursor may be introduced into the chamber at a flow ratio of the second precursor and the third precursor of about 0 to about 1 to provide a sub-layer having the composition $AC_Y$. Therefore, the ternary material layer may comprise a sub-layer of two elements. However, the ternary material layer 540 as a whole comprises three elements. In addition, the ternary material layer 540 may be gradually tuned to provide a graded layer comprising a plurality of sub-layers providing a gradually altering composition. Not wishing to be bound by theory, it is believed that a graded layer may provide a film having improved stress characteristics. In addition, it is believed that a graded layer may provide improved adhesion of the sub-layers with one another.

Figure 6:
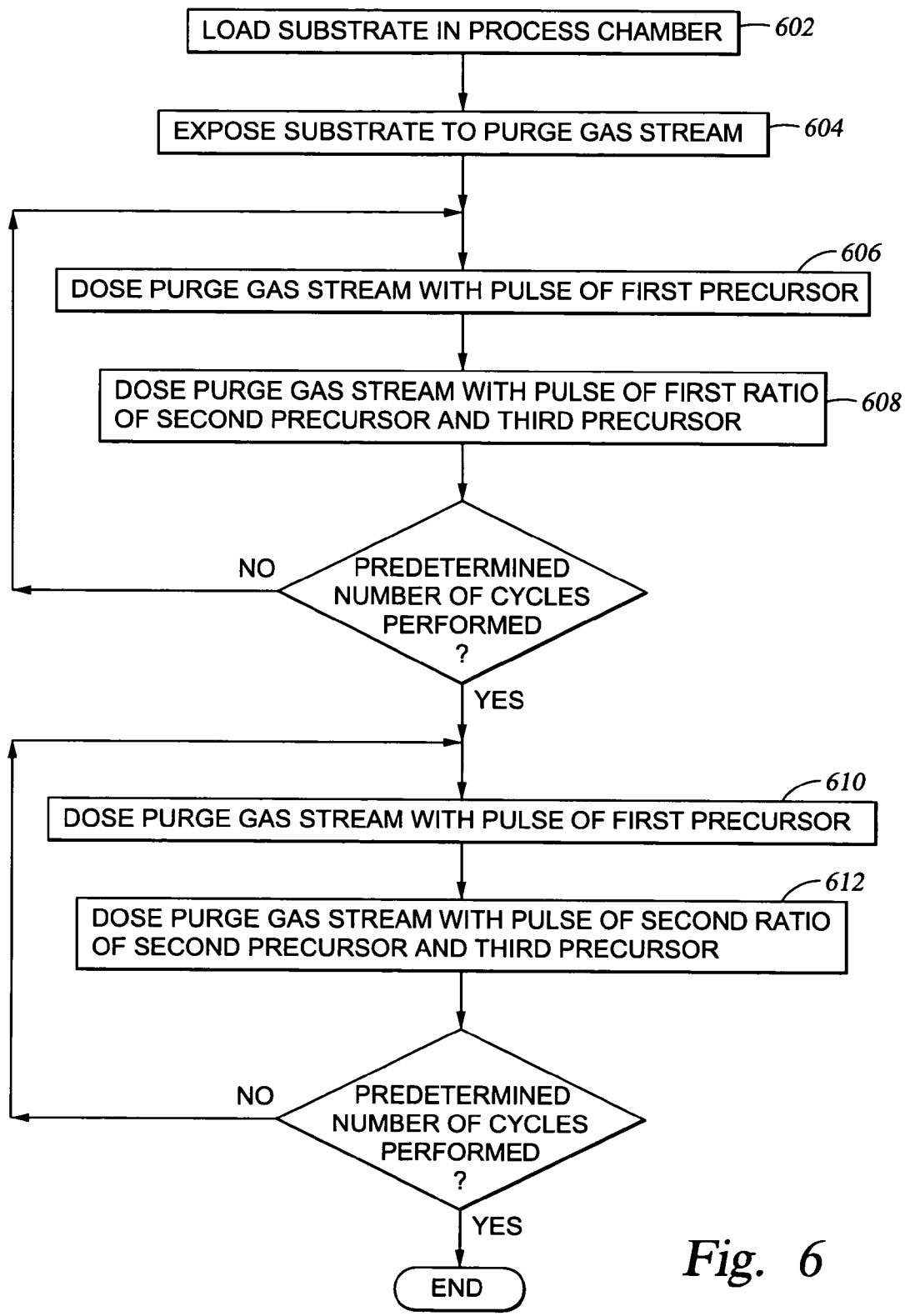
FIG. 6 is a flow chart illustrating one embodiment of a process utilizing a continuous flow of a purge gas to deposit a ternary material layer with a tuned composition.

FIG. 6 is a flow chart illustrating one embodiment of a process utilizing a continuous flow of a purge gas to deposit a ternary material layer with a tuned composition or a variable content composition. These steps may be performed in a chamber, such as chamber 100 described in reference to FIGS. 1 and 1A and chamber 210 described in reference to FIG. 2. As shown in step 602, a substrate is provided to the process chamber. The process chamber conditions, such as for example the substrate temperature and pressure, may be adjusted. In step 604, a purge gas stream is established within the process chamber. Referring to step 606, after the purge gas stream is established within the process chamber, a pulse of a first precursor is added or dosed into the purge gas stream. In step 608, after the pulse of the first precursor, a pulse of a second precursor and a third precursor is dosed into the purge gas stream at a first ratio of the second precursor to the third precursor. Step 606 and step 608 are repeated until a predetermined number of cycles are performed to form a first sub-layer. Referring to step 610, after a predetermined number of cycles of step 606 and step 608 are performed, a pulse of the first precursor is dosed into the purge gas stream. In step 612, after the pulse of the first precursor, a pulse of the second precursor and the third precursor is dosed into the purge gas stream at a second ratio of the second precursor to the third precursor. Step 610 and step 612 are repeated until a predetermined number of cycles are performed to form a second sub-layer. Other embodiments include depositing a ternary material layer with a tuned composition comprising more than two sub-layers. Other embodiments of a process utilizing a continuous flow of a purge gas are possible to deposit a ternary material layer with a tuned composition. For example, the second precursor and the third precursor may be introduced in partially overlapping pulses.

Figure 7:
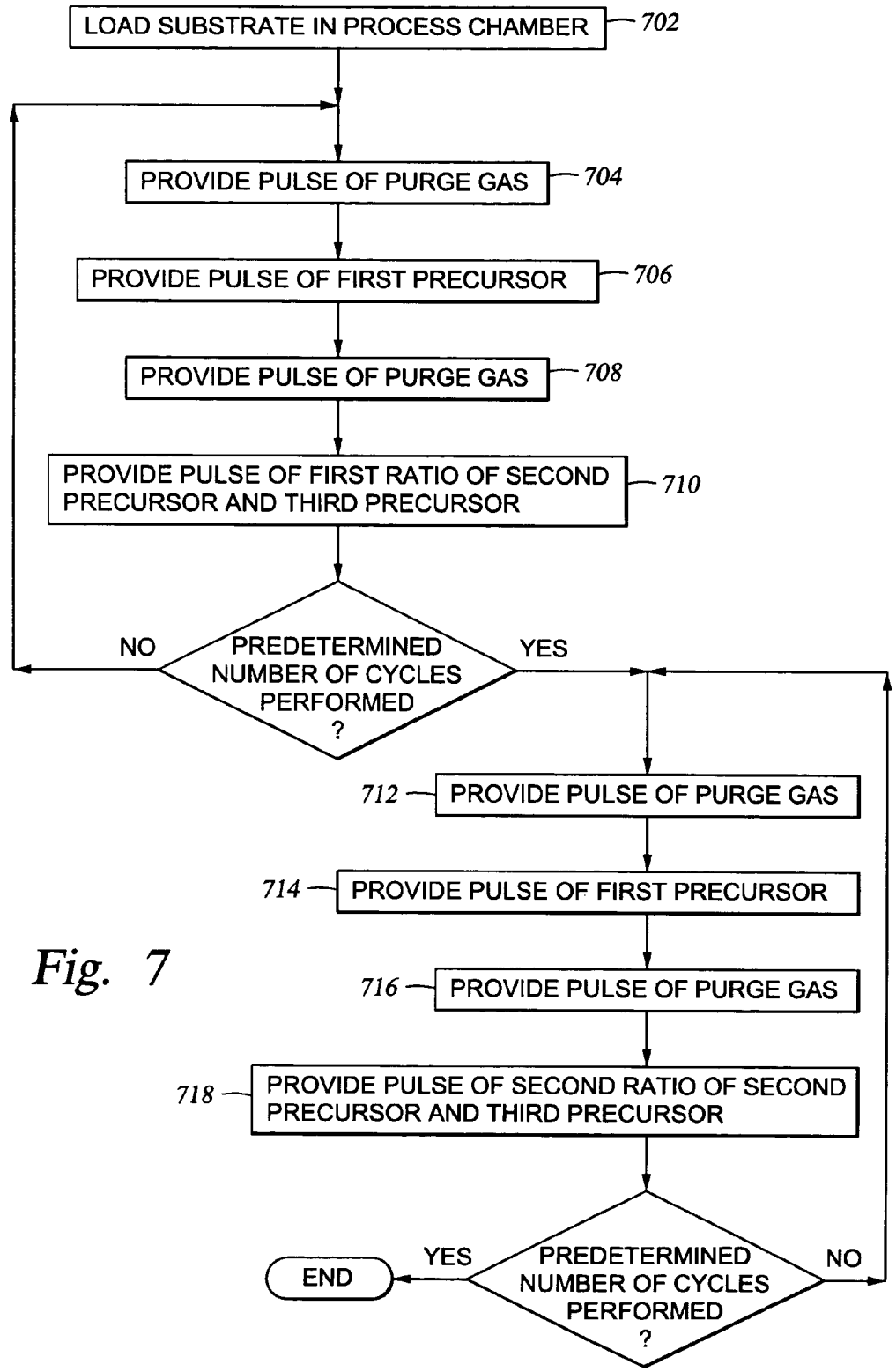
FIG. 7 is a flow chart illustrating one embodiment of a process utilizing pulses of a purge gas to deposit a ternary material layer with a tuned composition.

FIG. 7 is a flow chart illustrating one embodiment of a process utilizing pulses of a purge gas to deposit a ternary material layer with a tuned composition or a variable content composition. These steps may be performed in a chamber, such as chamber 100 described in reference to FIGS. 1 and 1A and chamber 210 described in reference to FIG. 2. As shown in step 702, a substrate is provided to the process chamber. The process chamber conditions, such as for example the substrate temperature and pressure, may be adjusted. In step 704, a pulse of a purge gas is provided to the process chamber. Referring to step 706, after the pulse of the purge gas of step 704 is introduced, a pulse of a first precursor is provided to the process chamber. In step 708, after the pulse of the first precursor is provided, another pulse of the purge gas is provided to the process chamber. In step 710, after the pulse of the purge gas of step 708 is introduced, a pulse of a second precursor and a third precursor is provided to the process chamber at a first ratio of the second precursor to the third precursor. Steps 704, 706, 708, 710 are repeated until a predetermined number of cycles are performed to form a first sub-layer. Referring to step 712, after a predetermined number of cycles of steps 704, 706, 708, 710 are performed, another pulse of the purge gas is provided to the process chamber. Referring to step 714, after the pulse of the purge gas of step 712 is introduced, a pulse of the first precursor is provided to the process chamber. In step 716, after the pulse of the first precursor is provided, another pulse of the purge gas is provided to the process chamber. In step 718, after the pulse of the purge gas of step 716 is introduced, a pulse of the second precursor and the third precursor is provided to the process chamber at a second ratio of the second precursor to the third precursor. Steps 712, 714, 716, and 718 are repeated until a predetermined number of cycles are performed to form a second sub-layer. Other embodiments include depositing a ternary material layer with a tuned composition or variable content composition comprising more than two sub-layers. Also, other embodiments of a process utilizing pulses of a purge gas are possible to deposit a ternary material layer with a tuned composition or variable content composition. For example, the second precursor and the third precursor may be introduced in partially overlapping pulses.

One example of a specific ternary compound with may be formed by overlapping pulses of two precursors is tungsten boron silicon ($WB_xSi_y$) utilizing a tungsten precursor, a boron precursor, and a silicon precursor. The tungsten boron silicon ($WB_xSi_y$) may comprise tungsten to boron to silicon in a ratio in which "X" is between about to 0.0 and about 0.35 and in which "Y" is between about 0.0 and about 0.20. In one embodiment, tungsten boron silicon ($WB_xSi_y$) is formed by overlapping pulses of the boron precursor and the silicon precursor. Applications of tungsten boron silicon ($WB_xSi_y$) include, but are not limited to, use as a nucleation layer to aid deposition of material thereover, such as tungsten, or use as a barrier layer to prevent diffusion of a metal deposited thereover, such as copper, aluminum, or combinations thereof.

The tungsten precursor preferably comprise tungsten hexafluoride ($WF_6$). Other examples of tungsten precursors include, but are not limited to, tungsten carbonyl ($W(CO)_6$), tungsten hexachloride ($WCl_6$), and derivatives thereof. The boron precursor preferably comprises diborane ($B_2H_6$). Other examples of boron precursors include, but are not limited to diborane, triborane, tetraborane, pentaborane, hexaborane, heptaborane, octaborane, nonaborane, decaborane, and derivatives thereof. The silicon precursor preferably comprises silane ($SiH_4$) to reduce the likelihood of a co-reaction between the boron precursor and the silicon precursor. Other silicon precursors include, but are not limited to disilane ($Si_2H_6$), chlorosilane ($SiH_3Cl$), dichlorosilane ($SiH_2Cl_2$), trichlorosilane ($SiHCl_3$), silicon tetrachloride ($SiCl_4$), hexachlorodisilane ($Si_2Cl_6$), and derivatives thereof.

Another example of a specific ternary compound which may be formed by overlapping pulses of two precursors is titanium silicon nitride ($TiSi_xN_y$) utilizing a titanium precursor, a silicon precursor, and a nitrogen precursor. The titanium silicon nitride ($TiSi_xN_y$) may comprise titanium to silicon to nitrogen in a ratio in which "X" is between about 0.0 and about 2.0 and in which "Y" is between about 0.0 and about 1.0. In one embodiment, titanium silicon nitride ($TiSi_xN_y$) is formed by overlapping pulses of the silicon precursor and the nitrogen precursor. Applications of titanium silicon nitride ($TiSi_xN_y$) include, but are not limited to, use as a barrier layer for subsequent deposition of a metal layer thereover, such as a layer comprising copper, aluminum, or combinations thereof.

The titanium precursor preferably comprises titanium tetrachloride ($TiCl_4$). Examples of other titanium precursors include, but are not limited to, titanium iodide ($TiI_4$), titanium bromide ($TiBr_4$), other titanium halides, tetrakis(dimethylamino)titanium (TDMAT), tetrakis(diethylamino)titanium (TDEAT), other metal organic compounds, and derivatives thereof. The silicon precursor preferably comprises silane ($SiH_4$) to reduce the likelihood of a co-reaction between the silicon precursor and the nitrogen precursor. Other silicon precursors include, but are not limited to disilane ($Si_2H_6$), chlorosilane ($SiH_3Cl$), dichlorosilane ($SiH_2Cl_2$), trichlorosilane ($SiHCl_3$), silicon tetrachloride ($SiCl_4$), hexachlorodisilane ($Si_2Cl_6$), and derivatives thereof. The nitrogen precursor preferably comprises ammonia ($NH_3$). Examples of other nitrogen precursors include, but are not limited to hydrazine ($N_2H_4$), other $N_xH_y$ compounds with x and y being integers, dimethyl hydrazine (($CH_3$)$_2N_2H_2$), t-butylhydrazine ($C_4H_9N_2H_3$), phenylhydrazine ($C_6H_5N_2H_3$) 2,2'-azoisobutane, ethylazide ($C_2H_5N_3$), and derivatives thereof.

Another example of a specific ternary compound which may be formed by overlapping pulses of two precursors is tantalum silicon nitride ($TaSi_xN_y$) utilizing a tantalum precursor, a silicon precursor, and a nitrogen precursor. The tantalum silicon nitride ($TaSi_xN_y$) may comprise tantalum to silicon to nitrogen in a ratio in which "X" is between about 0.0 and about 1.0 and in which "Y" is between about 0.0 and about 2.0. In one embodiment, tantalum silicon nitride ($TaSi_xN_y$) is formed by overlapping pulses of the silicon precursor and the nitrogen precursor. Applications of tantalum silicon nitride ($TaSi_xN_y$) include, but are not limited to, use as a barrier layer for subsequent deposition of a metal layer thereover, such as a layer comprising copper, aluminum, or combinations thereof.

The tantalum precursor preferably comprises tantalum pentachloride ($TaCl_5$). Examples of other tantalum precursors include, but are not limited to tantalum fluoride ($TaF_5$), tantalum bromide ($TaBr_5$), pentakis(dimethylamino)tantalum (PDMAT; Ta($NMe_2$)$_5$), pentakis(ethylmethylamino)tantalum (PEMAT; Ta[N(Et)Me]$_5$), pentakis(diethylamino)tantalum (PDEAT; Ta($NEt_2$)$_5$), TBTDET (Ta($NEt_2$)$_3NC_4H_9$ or $C_{16}H_{39}N_4Ta$), and derivatives thereof.

The silicon precursor preferably comprises silane ($SiH_4$) to reduce the likelihood of a co-reaction between the silicon precursor and the nitrogen precursor. Other silicon precursors include, but are not limited to chlorosilane ($SiH_3Cl$), dichlorosilane ($SiH_2Cl_2$), trichlorosilane ($SiHCl_3$), silicon tetrachloride ($SiCl_4$), hexachlorodisilane ($Si_2Cl_6$), and derivatives thereof. The nitrogen precursor preferably comprises ammonia ($NH_3$). Examples of other nitrogen precursors include, but are not limited to hydrazine ($N_2H_4$), other $N_xH_y$ compounds with x and y being integers, dimethyl hydrazine (($CH_3$)$_2N_2H_2$), t-butylhydrazine ($C_4H_9N_2H_3$), phenylhydrazine ($C_6H_5N_2H_3$), 2,2'-azoisobutane, ethylazide ($C_2H_5N_3$), and derivatives thereof.

Still another example of a specific ternary compound which may be formed by overlapping pulses of two precursors is silicon oxynitride ($SiO_xN_y$) utilizing a silicon precursor, an oxygen precursor, and a nitrogen precursor. The silicon oxynitride may comprise silicon to oxygen to nitrogen in a ratio in which "X" is between about 0.0 and about 2.0 and in which "Y" is between about 0 and about 1.33. For example, when X is about 2.0 and Y is about 0.0, the silicon oxynitride will comprise $SiO_2$. For example, when X is about 0.0 and Y is about 1.33, the silicon oxynitride will comprise $Si_3N_4$. In one embodiment, silicon oxynitride ($SiO_xN_y$) is formed by overlapping pulses of the oxygen precursor and the nitrogen precursor. Applications of silicon oxynitride include, but are not limited to, use as an anti-reflective coating, a dielectric layer, or a barrier layer.

The silicon precursor preferably comprises silicon tetrachloride ($SiCl_4$). Other silicon precursors include, but are not limited to silane ($SiH_4$), disilane ($Si_2H_6$), chlorosilane ($SiH_3Cl$), dichlorosilane ($SiH_2Cl_2$), trichlorosilane ($SiHCl_3$), hexachlorodisilane ($Si_2Cl_6$), and derivatives thereof. The oxygen precursor preferably comprises water vapor ($H_2O$). Other oxygen precursors include, but are not limited to, oxygen gas ($O_2$) and ozone ($O_3$). The nitrogen precursor preferably comprises ammonia ($NH_3$). Examples of other nitrogen precursors include, but are not limited to hydrazine ($N_2H_4$), other $N_xH_y$ compounds with x and y being integers, dimethyl hydrazine (($CH_3$)$_2N_2H_2$), t-butylhydrazine ($C_4H_9N_2H_3$), phenylhydrazine ($C_6H_5N_2H_3$), 2,2'-azoisobutane, ethylazide ($C_2H_5N_3$), and derivatives thereof.

Still another example of a specific ternary compound which may be formed by overlapping pulses of two precursors is hafnium silicon oxide ($HfSi_xO_y$) utilizing a hafnium precursor, a silicon precursor, and a oxygen precursor. The hafnium silicon oxide may comprise hafnium to silicon to oxygen in a ratio in which "X" is between about 0.0 and about 0.5 and in which "Y" is between about 0.0 and about 1.0. In one embodiment, hafnium silicon oxide ($HfSi_xO_y$) is formed by overlapping pulses of the silicon precursor and the oxygen precursor. Applications of hafnium silicon oxide include, but are not limited to, use as a high-k dielectric material layer.

An example of a hafnium precursor includes, but is not limited to, hafnium tetrachloride ($HfCl_4$) and derivatives thereof. The silicon precursor preferably comprises silane ($SiH_4$) to reduce the likelihood of a co-reaction between the silicon precursor and the oxygen precursor. Other silicon precursors include, but are not limited to disilane ($Si_2H_6$), chlorosilane ($SiH_3Cl$), dichlorosilane ($SiH_2Cl_2$), trichlorosilane ($SiHCl_3$), silicon tetrachloride ($SiCl_4$), hexachlorodisilane ($Si_2Cl_6$), and derivatives thereof. The oxygen precursor preferably comprises water vapor ($H_2O$). Other oxygen precursors include, but are not limited to, oxygen gas ($O_2$) and ozone ($O_3$).

While foregoing is directed to the preferred embodiment of the present invention, other and further embodiments of the invention may be devised without departing from the basic scope thereof, and the scope thereof is determined by the claims that follow.

The invention claimed is:

1. A method for forming a hafnium-containing dielectric material layer, comprising:
sequentially pulsing a first precursor, a second precursor, and a hafnium-containing precursor, wherein the first precursor is pulsed at least partially overlapping with the hafnium-containing precursor or the second precursor.

2. The method of claim 1, wherein the second precursor is water or diborane.

3. The method of claim 1, wherein the second precursor is an oxygen-containing precursor.

4. The method of claim 3, wherein the oxygen-containing precursor is selected from the group consisting of water vapor, oxygen, ozone, and combinations thereof.

5. The method of claim 1, wherein the second precursor is ammonia.

6. The method of claim 1, wherein, the second precursor is water.

7. The method of claim 1, wherein the first precursor is a silicon precursor.

8. The method of claim 7, wherein the silicon precursor selected from the group consisting of tetrachlorosilane, dichlorosilane, and hexachlorodisilane.

9. A method for forming a hafnium-containing dielectric material layer, comprising:
sequentially pulsing a first precursor, a silicon precursor, and a hafnium-containing precursor, wherein the silicon precursor is pulsed at least partially overlapping with the hafnium-containing precursor or the first precursor.

10. The method of claim 9, wherein the first precursor is water or diborane.

11. The method of claim 9, wherein the first precursor is an oxygen-containing precursor.

12. The method of claim 11, wherein the oxygen containing precursor is selected from the group consisting of water vapor, oxygen, ozone, and combinations thereof.

13. The method of claim 9, wherein the first precursor is ammonia.

14. The method of claim 9, wherein the first precursor is water.

15. The method of claim 9, wherein silicon precursor is selected from the group consisting of tetrachlorosilane, dichiorosilane, and hexachlorodisilane and wherein the first precursor is water or diborane.

* * * * *

UNITED STATES PATENT AND TRADEMARK OFFICE
CERTIFICATE OF CORRECTION

PATENT NO. : 7,396,565 B2  
APPLICATION NO. : 10/913888  
DATED : July 8, 2008  
INVENTOR(S) : Yang et al.

Page 1 of 1

It is certified that error appears in the above-identified patent and that said Letters Patent is hereby corrected as shown below:

Title Page

In the References Cited (56):

Please delete "6,874,138 B1 1/2004 Halliyal et al." and insert --6,674,138 B1 1/2004 Halliyal et al.-- therefor;

Please delete "2004/0043830 A1 3/2004 Vaartstra et al." and insert --2004/0043630 A1 3/2004 Vaartstra et al.-- therefor;

In the Detailed Description:

Column 5, Line 25, please delete "2003/011608" and insert --2003/0116087-- therefor;

In the Claims:

Column 18, Claim 15, Line 23, please delete "dichiorosilane" and insert --dichlorosilane-- therefor.

Signed and Sealed this

Twenty-third Day of December, 2008

JON W. DUDAS  
*Director of the United States Patent and Trademark Office*